US006913866B2

(12) United States Patent
Shimomura et al.

(10) Patent No.: US 6,913,866 B2
(45) **Date of Patent: *Jul. 5, 2005**

(54) MULTICOLOR IMAGE-FORMING MATERIAL AND MULTICOLOR IMAGE-FORMING METHOD

(75) Inventors: Akihiro Shimomura, Shizuoka (JP); Hideyuki Nakamura, Shizuoka (JP); Shinichi Yoshinari, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/864,594

(22) Filed: Jun. 10, 2004

(65) Prior Publication Data

US 2004/0224248 A1 Nov. 11, 2004

Related U.S. Application Data

(63) Continuation of application No. 10/098,454, filed on Mar. 18, 2002, now Pat. No. 6,811,946.

(30) Foreign Application Priority Data

| | | |
|---|---|---|
| Mar. 19, 2001 | (JP) | P. 2001-079183 |
| Mar. 19, 2001 | (JP) | P. 2001-079554 |
| Mar. 12, 2002 | (JP) | P. 2002-067009 |

(51) Int. Cl.$^7$ .............................. G03F 7/34; G03F 7/11
(52) U.S. Cl. ........................................ 430/200; 430/637
(58) Field of Search .................................. 430/200, 637

(56) References Cited

U.S. PATENT DOCUMENTS

| | | | |
|---|---|---|---|
| 5,053,381 | A | 10/1991 | Chapman et al. |
| 5,126,760 | A | 6/1992 | DeBoer |
| 5,242,887 | A | 9/1993 | Usui |
| 5,300,398 | A | 4/1994 | Kaszczuk |
| 5,352,562 | A | 10/1994 | Takahashi et al. |
| 5,512,931 | A | 4/1996 | Nakajima et al. |
| 5,580,693 | A | 12/1996 | Nakajima et al. |
| 5,593,808 | A | 1/1997 | Ellis |
| 5,611,881 | A | 3/1997 | Kimura et al. |
| 5,629,129 | A | 5/1997 | Yamamoto et al. |
| 6,027,850 | A | 2/2000 | Kawakami et al. |
| 6,461,787 | B2 | 10/2002 | Warner et al. |
| 2001/0003637 | A1 | 6/2001 | Goto |
| 2002/0187418 | A1 | 12/2002 | Nakamura et al. |

FOREIGN PATENT DOCUMENTS

| | | | |
|---|---|---|---|
| JP | 9-30128 | A | 2/1997 |
| JP | 9-169165 | A | 6/1997 |
| JP | 10-264542 | A | 10/1998 |
| JP | 2000-71634 | A | 3/2000 |
| JP | 2000-135862 | A | 5/2000 |
| JP | 2000-168252 | A | 6/2000 |
| JP | 2001-10244 | A | 1/2001 |
| JP | 2001-39040 | A | 2/2001 |

*Primary Examiner*—Richard L. Schilling
(74) *Attorney, Agent, or Firm*—Sughrue Mion, PLLC

(57) ABSTRACT

A multicolor image-forming material comprising: an image-receiving sheet comprising a support and an image-receiving layer; and at least four thermal transfer sheets each comprising a support, a light-to-heat converting layer and an image-forming layer, and each having a different color, wherein an image is formed by the method comprising the steps of: superposing each one of the at least four thermal transfer sheets on the image-receiving sheet to be in a state of the image-forming layer being in contact with the image-receiving layer; and irradiating the thermal transfer sheet with a laser beam to transfer an image in an area of the image-forming layer subjected to irradiation onto the image-receiving layer, and at least one layer selected from layers comprised in the image-receiving sheet and the at least four thermal transfer sheets comprises a fluorine-series surface active agent which is a homopolymer comprising a polymerizable monomer represented by the formula (1) and having a weight average molecular weight Mw of 3000 or more.

4 Claims, 2 Drawing Sheets

MULTICOLOR IMAGE-FORMING MATERIAL AND MULTICOLOR IMAGE-FORMING METHOD

This is a continuation of application Ser. No. 10/098,454 filed Mar. 18, 2002 now U.S. Pat. No. 6,811,946; the disclosure of which is incorporated herein by reference.

FIELD OF THE INVENTION

The present invention relates to materials used suitably for forming a multicolor image by use of a laser beam and a method for forming the multicolor image by use of the materials.

BACKGROUND OF THE INVENTION

In the field of graphic art, printing plates are printed by use of a set of color separation films prepared from a color original by use of lith films. In general, in order to check errors in the color separation process or necessity of the color correction before printing (practical printing operation), a color proof is prepared from color separation films. To the color proof, realization of high resolving power that enables high reproduction of medium images and performance such as high stability to the process are expected. Furthermore, in order to obtain the color proof similar to practical printed matter, materials practically used for printed matter are preferably used as materials for the color proof, for example, actual printing paper (regular paper used in running on to give a final product) is used as a base and pigments are used as coloring materials. Moreover, for the preparation of the color proof, a dry process where no developing solution is used has been highly desired.

With contribution of an electronic system in the latest pre-process of printing (prepress field), a recording system for preparing directly the color proof from digital signals has been developed as the dry process for preparing the color proof. This electronic system aims at preparing the color proof of a particularly high image quality. In general, a dot image of 150 lines/inch or more are reproduced. In order to record the proof of a high image quality from the digital signals, the laser beam that can be modulated by digital signs and can be stopped down as recording beams are used as recording heads. Recording materials having high recording sensitivity to the laser beam and high resolving power that enables reproduction of highly fine halftone dots must be developed.

Known recording materials used for a method for forming a transfer image by making use of the laser beam are hot melt transfer sheets having a light-to-heat conversion layer that absorbs the laser beam to generate heat and an image-forming layer that contains pigment dispersed in components such as a hot melt wax and a hot melt binder on a support in this order (Japanese Patent Laid-Open No. 58045/1993). In the method for forming images by using these recording materials, heat generated in areas irradiated with the laser beam in the light-to-heat conversion layer melts the image-forming layer corresponding to the areas, and the melted areas transfer to an image-receiving sheet laminated on a transfer sheet to form a transfer image on the image-receiving sheet.

Furthermore, Japanese Patent Laid-Open No. 219052/1994 discloses a thermal transfer sheet where a light-to-heat conversion layer containing a light-to-heat convertible substance, a heat peel layer formed of a very thin film (0.03 to 0.3 $\mu$m), and an image-forming layer containing a coloring material are provided on a support in this order. In this thermal transfer sheet, binding power between the image-forming layer and the light-to-heat conversion layer that are bound through the aforesaid heat peel layer reduces by irradiation with the laser beam to form a highly fine image on an image-receiving sheet laminated on the thermal transfer sheet. In this method for forming images by use of the thermal transfer sheet, the so-called "abrasion" is utilized. This phenomenon is utilized as follows: In areas irradiated with a laser beam, the heat peel layer is partly decomposed and vaporized, the binding power between the image-forming layer and the light-to-heat conversion layer in the areas is weakened, and the image-forming layer in the areas is transferred to the image-receiving sheet laminated thereon.

These methods for forming images have the advantages in that the actual printing paper having an image-receiving layer (adhesive layer) attached can be used and the multicolor image is obtained with ease by transferring successively images different in color to the image-receiving sheet. These methods enable easy formation of highly fine images and are useful for the preparation of the color proof (DDCP: direct digital color proof) or a highly fine mask image.

SUMMARY OF THE INVENTION

In the materials used for the methods for forming the multicolor image, the light-to-heat conversion layer and the image-forming layer of the thermal transfer sheet are formed by a coating method. In addition, the image-receiving layer on the image-receiving sheet also is formed by the coating method. Furthermore, the image-forming layer of the thermal transfer sheet requires a uniformly coated surface in order to acquire stable transfer (sensitivity). Non-uniformly coated surfaces produce irregularities in evenness of the surfaces, surface energy, and adhesive powder, resulting in deteriorating uniform transfer to the image-receiving sheet. Moreover, the image-receiving layer of the image-receiving sheet also requires uniformly coated surface for stable transfer of an image formed on the image-forming layer of the thermal transfer sheet without irregularities in transfer.

Accordingly, an aim of the invention to provide materials used appropriately for the method for forming the multicolor image and having anyone sheet or both sheets of a thermal transfer sheet which has an image-forming layer with a uniformly coated surface and is improved in properties of transferring of an image formed on the image-forming layer to an image-receiving sheet and an image-receiving sheet which has an image-receiving layer with a uniformly coated surface and is improved in the properties of transferring of the image formed on the image-forming layer from the thermal transfer sheet.

Another aim of the invention is to provide a method for forming the multicolor image by use of the materials having acquired excellent performance by the improvement in the properties of transferring.

In order to achieve the aims, the invention provides materials for forming the multicolor image that have the following constitution and a method for forming the multicolor image by use of the materials.

1. Materials for forming a multicolor image where by use of an image-receiving sheet having at least an image-receiving layer on a support and four kinds of thermal transfer sheets different in color and each having at least a light-to-heat conversion layer and an image-forming layer on a support, images are recorded by superposing the respective thermal transfer sheets and the image-receiving sheet so that the image-forming layer of the respective thermal transfer sheets and the image-receiving layer of the image-receiving sheet face each other, irradiating with a laser beam, and transferring the image-forming layer's areas irradiated with the laser beam to the image-receiving layer of the image-receiving sheet wherein at least one of layers contained in the image-receiving sheet and/or the respective thermal transfer sheets contains a fluorine-series surface active agent of a homopolymer prepared from a polymerizable monomer represented by the following formula (1) and having a weight average molecular weight Mw of 3000 or more:

$$C_nF_{2n+1}\text{-L-}CH_2CH_2\text{—O—C(=O)—CR=}CH_2 \quad (1)$$

(In formula (1), n represents an integer of from two to 14. R represents a hydrogen atom or an alkyl group having one to 10 carbon atoms. L represents a single bond or a divalent organic group containing at least one atom selected from an oxygen atom, a nitrogen atom, a sulfur atom, and a carbon atom.)

2. The materials as described in the preceding item 1 wherein the fluorine-series surface active agent is contained in the image-forming layer of the respective thermal transfer sheets.

3. The materials as described in the preceding item 1 wherein the fluorine-series surface active agent is contained in the image-receiving layer and/or a cushion layer of the image-receiving sheet.

4. The materials as described in the preceding item 1 wherein the fluorine-series surface active agent is contained in the image-forming layer of the respective thermal transfer sheets and the image-receiving layer and/or the cushion layer of the image-receiving sheet.

5. The materials as described in the preceding items 1 to 4 wherein the fluorine-series surface active agent comprises a homopolymer prepared from a polymerizable monomer represented by the following formula (2):

$$C_nF_{2n+1}\text{—}CH_2CH_2SO_2N(\text{—}R_1)\text{—}CH_2CH_2\text{—O—C(=O)—CR=}CH_2 \quad (2)$$

(In formula (2), $R_1$ has the same meaning as R in formula (1) and n is the same as n in formula (1).)

6. A method for forming a multicolor image through a process for image recording where by use of an image-receiving sheet having at least an image-receiving layer on a support and at least four kinds of thermal transfer sheets for yellow, magenta, cyan, and black each having at least a light-to-heat conversion layer and an image-forming layer on a support, the respective thermal transfer sheets and the image-receiving sheet superposed so that the image-forming layer of the respective thermal transfer sheets and the image-receiving later of the image-receiving sheet face each other are irradiated with a laser beam to transfer the image-forming layer's areas irradiated with the laser beam to the image-receiving layer of the image-receiving sheet wherein the thermal transfer sheets and the image-receiving sheet of the materials for forming the multicolor image as described in any one of the preceding 1 to 5 are used as the thermal transfer sheets and the image-receiving sheet as described above.

BRIEF DESCRIPTION OF THE DRAWINGS

The invention can be described in more detail with the help of the accompanying drawings wherein FIG. 1 (1*a*, 1*b* and 1*c*) shows the outline of a mechanism for forming a multicolor image depending upon film thermal transfer with the aid of a laser.

DESCRIPTION OF REFERENCE CHARACTERS

Figure 1A:
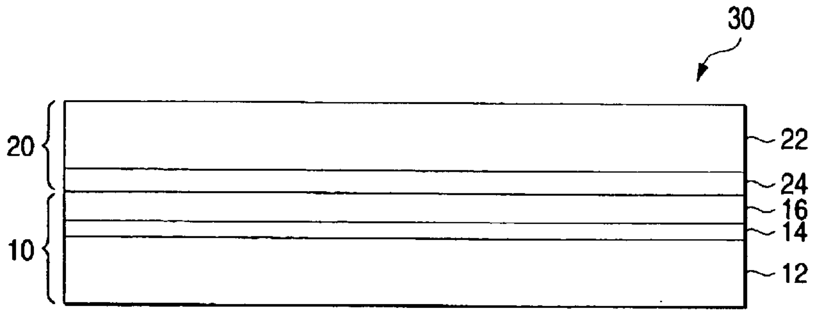

1: Recording unit
2: Recording head
3: By-scan rail
4: Recording drum
5: Thermal transfer sheet-loading unit
6: Image-receiving sheet roll
7: Carrier roller
8: Squeeze roller
9: Cutter
10: Thermal transfer sheet
10K, 10C, 10M, 107: Thermal transfer sheet rolls
12: Support
14: Light-to-heat converting layer
16: Image-forming layer
20: Image-receiving sheet
22: Support for image-receiving sheet
24: Image-receiving layer
30: Laminate
31: Discharge platform
32: Discarding opening
33: Discharge opening
34: Air
35: Discarding box

DETAILED DESCRIPTION OF THE INVENTION

In the materials for forming the multicolor image of the invention, any one or both of the respective thermal transfer sheets and the image-receiving sheet contain a fluorine-series surface active agent of a homopolymer prepared from a polymerizable monomer shown in the formula (1) as described above in at least one of layers contained in these sheets, preferably in at least the image-forming layer in the respective thermal transfer sheets, and preferably in at least the image-receiving layer and/or the cushion layer in the image-receiving sheet. The weight average molecular weight of the homopolymer is 3000 or more and preferably ranges from 6000 to 30,000.

The respective layers of the thermal transfer sheets and the image-receiving sheet are formed by applying the coating solutions for forming the respective layers. The addition of the fluorine-series surface active agent to the coating solutions improves the affinity thereof to the surfaces to be applied, and a phenomenon by which the surfaces to be applied repel the coating solutions and a phenomenon by which non-uniform vaporization of solvents occurs in a drying step after coating to produce non-uniformity in thickness of the resulting film are inhibited. As a result, the surfaces of the coated layers become uniform.

In the thermal transfer sheets, particularly, the addition of the fluorine-series surface active agent to a coating solution for forming the image-forming layer brings about a uniform surface to the layer and stable transfer (sensitivity). In the image-receiving sheet, furthermore, the addition of the fluorine-series surface active agent to a coating solution for forming the image-receiving layer provides uniform surface to the layer and allows the image formed on the image-forming layer of the thermal transfer sheet to transfer to the image-receiving layer without unevenness.

The fluorine-series surface active agent is added to coating solutions for forming all layers preferably in an amount of from 0.005 to 1 mass part and more preferably from 0.01 too 0.5 mass part in the coating solutions.

In formula (1), n is an integer of from two to 14 and preferably from six to 12.

R is a hydrogen atom or an alkyl group having one to 10 carbon atoms, and preferably a hydrogen atom or an alkyl group having one to four carbon atoms. Examples of the alkyl groups include $CH_3$, $C_2H_5$, n-$C_3H_7$, iso-$C_3H_7$, n-$C_4H_9$, iso-$C_4H_9$, and tert-$C_4H_9$.

L represents a single bond or a divalent organic group containing at least one atom selected from oxygen atom, nitrogen atom, sulfur atom, and carbon atom. Preferred L includes a single bond, —O—, —$SO_2$—, —NH—, —$SO_2$NH—, and —$CH_2$—.

The monomers represented by the formula (2) comprehended by formula (1) represent one group of preferred monomers. $R_1$ in formula (2) has the same meaning as R in formula (1), and n is the same as n in formula (1).

Examples of preferred monomers represented by formula (1) are shown in Table 1.

TABLE 1

| Compound No. | R | General Formula (1) n | L |
|---|---|---|---|
| 1 | H | 8 | single bond |
| 2 | H | 12 | single bond |
| 3 | H | 2 | single bond |
| 4 | $CH_3$ | 8 | single bond |
| 5 | H | 8 | —$(CH_2)_2SO_2N(CH_3)$— |
| 6 | H | 8 | —O— |
| 7 | H | 8 | —$SO_2$— |
| 8 | H | 8 | —NH— |
| 9 | $CH_3$ | 10 | —$CH_2$— |

The homopolymers having weight average molecular weights of 3000 or more can be prepared by polymerizing the monomers represented by formula (1) according to a common radical polymerization method.

The materials for forming the multicolor image of the invention is suitably used in the method for forming the multicolor image where a laser beam is used as described above. The method for forming the multicolor image by use of the materials for forming the multicolor image of the invention is hereinafter illustrated in detail. Particularly, the thermal transfer sheets and the image-receiving sheet are illustrated in further detail.

The method for forming the multicolor image by use of the materials of the invention realizes a thermal transfer image with sharp halftone dots and in addition is useful and suitable for systems that enable transfer to the actual printing paper and B2 size recording (515 mm×728 mm. Herein, B2 size is 543 mm×765 mm).

The thermal transfer image is formed as a halftone dot image according to the number of printed lines with resolving power of 2400 to 2540 dpi. Each dot is very sharp almost without blurring and breaking and accordingly, halftone dots of a broad range of from highlight to shadow can be clearly formed. As a result, a high-quality halftone dot output can be carried out with the resolving power similar to an image setter and CTP setter to reproduce halftone dots and gradation good in similarity to printed matter.

The thermal transfer image is sharp in shapes of the halftone dots to reproduce the halftone dots corresponding to the laser beam with high fidelity. Furthermore, since the dependence of the recording characteristics on the environmental temperature and humidity is very small, the image can obtain repeated reproducibility stable in both hue and density under the wide environment of temperature and humidity.

Since the thermal transfer image is formed of color pigments used for printing inks and has good repeated reproducibility, a CMS (color management system) of high precision can be realized.

Since the thermal transfer image is allowed to correspond almost to the hues of Japan color and SWOP color, that is, the hues of printed matter, the hues of the image under different light sources such as a fluorescent lamp and an incandescent lamp also change similarly to those of printed matter.

Since the thermal transfer image has sharp dot shapes, slender lines of fine letters also can be sharply reproduced. The heat generated by laser beam reaches the interface of transfer without diffusing in surface directions and the image-forming layer is sharply broken at the interface between the heated portion and the non-heated portion. In the thermal transfer sheets, therefore, thin film formation for the light-to-heat conversion layer and mechanical characteristics of the image-forming layer are controlled.

It is deduced from simulation that the light-to-heat conversion layer reaches about 700° C. in a moment, and when it is of a thin film, the layer tends to be deformed or broken. Occurrence of the deformation and breakage causes practical damage in that the light-to-heat conversion layer is transferred to the image-receiving layer together with the transfer layer or the transfer image becomes non-uniform. On the other hand, in order to obtain a specified temperature, it is required that a light-to-heat converting substance exists in high level, which invites problems such as the separation of dyes or transfer thereof to an adjacent layer.

Accordingly, for the light-to-heat conversion layer, formation of a thin film of about 0.5 μm or less is preferable by selecting infrared-absorbing dyes excellent in light-to-heat conversion characteristics and heat-resistant binders such as polyimide-series ones.

Deformation of the light-to-heat conversion layer and deformation of the image-forming layer itself by high temperatures in general bring about irregularities in thickness corresponding to the sub-scanning patterns of the laser beam to the image-forming layer transferred to the image-receiving layer, thereby to form non-uniform images and reduce apparent transfer densities. This tendency becomes more significant as the thickness of the image-forming layer decreases. On the other hand, a thick image-forming layer causes deterioration in sharpness of the dots and reduction in sensitivity.

In order to allow the compatibility of the capabilities contrary to each other, the addition of low melting substances such as waxes to the image-forming layer preferably leads to improvement of unevenness in transfer. Appropriate increase in the layer's thickness by using finely divided inorganic particles in place of binders permits sharp breakdown of the image-forming layer at the interfaces of heated portions and non-heated portions, thus to improve irregularities in transfer while maintaining the sharpness of the dots and sensitivity.

The low melting substances such as waxes in general tend to ooze or crystallize on the surface of the image-forming layer and in some cases invite problems in image quality and aging stability of the thermal transfer sheets.

In order to cope with the problems, low melting substances having small difference in Sp value to polymers in the image-forming layer are preferably used to increase compatibility with the polymer and prevent the low melting substances from separating from image-forming layer. Or several low melting substances having different structures are preferably mixed to allow compatibility and prevent crystallization. As a result, an image sharp in dot shape and small in irregularities is prepared.

The coated layers of the thermal transfer sheets in general absorb moisture to cause change in the mechanical properties and thermal properties of the layers, which produces dependence of the recording environment on humidity.

In order to decrease the dependence on temperature and humidity, it is preferable to change dye/binder-series of the light-to-heat conversion layer and binder-series of the image-forming layer to organic solvent-series. It also is preferable to select polyvinylbutyral as the binder of the image-receiving layer and simultaneously introduce a technique of making polymers hydrophobic to decrease the water absorption. The technique of making polymers hydrophobic includes reaction of hydroxyl group with hydrophobic group as disclosed in Japanese Patent Laid-Open No. 238858/1996 and crosslinking of two or more hydroxyl groups with a hardener.

The image-forming layer in general is exposed to heat of about 500° C. or more on printing by exposure to laser beam, and some pigments used so far underwent pyrolysis. However, the adoption of highly heat-resistant pigments enables prevention of the pyrolysis.

In order to prevent the change of the hue stemming from the transfer of infrared absorbing dyes from the light-to-heat conversion layer to the image-forming layer that is caused by increased heat on printing, it is preferable to design the light-to-heat conversion layer by combinations of the infrared absorbing dyes and binders having strong holding power as described above.

High-speed printing in general causes shortage of energy, and gaps are particularly produced corresponding to the intervals of sub-scanning of the laser. As described above, a higher density of dyes in the light-to-heat conversion layer and thin film formation for the light-to-heat conversion layer and the image-forming layer induce increase in the efficiency of generation and transfer of heat. Furthermore, for the purposes of enhancing the effect of filling up the gaps by slight flow of the image-forming layer on heating and the adhesion to the image-receiving layer, it is preferable to add a low melting substance to the image-forming layer. Moreover, in order to enhance the adhesion between the image-receiving layer and the image-forming layer and allow transfer images to have sufficient strength, it is preferable to adopt polyvinylbutyral as a binder for the image-receiving layer similarly to the image-forming layer.

The image-receiving sheet and the thermal transfer sheet are preferably held on a drum by vacuum adhesion. The vacuum adhesion is important because the adhesion between both sheets is controlled to form an image and accordingly the behavior of image transfer is very sensitive to the clearance between the image-receiving layer of the image-receiving sheet and the image-forming layer of the transfer sheet. A spread of the clearance between the materials caused by the presence of foreign matter such as dust results in producing image defects and irregularities in image transfer.

In order to prevent these image faults and irregularities in image transfer, it is preferable to form uniform unevenness on the thermal transfer sheets, so as to form uniform clearance and allow the air to pass well.

As methods of forming the unevenness on the thermal transfer sheet, there are post-treatment such as embossing treatment and the addition of a matting agent to a coated layer. The addition of the matting agent is preferred because of simplicity in the process of production and aging stability in the materials. The matting agent requires a size larger than the thickness of the coated layer. The addition of the matting agent to the image-forming layer invites a problem in that the image breaks in portions where the matting agent exists. Therefore, the matting agent with most appropriate particle size is preferably added to the light-to-heat conversion layer, so that the image-forming layer itself comes to have almost uniform thickness and an image having no defect can be formed on the image-receiving sheet.

In order to reproduce surely sharp dots as described above, the recording apparatus side also requires a high degree of precision in design. The apparatus is the same as conventional apparatus for the laser thermal transfer recording in basic constitution. The constitution is that of an outer drum recording system of the so-called heat mode where the thermal transfer sheet and the image-receiving sheet fixed on a drum are irradiated with lasers through a recording head equipped with plural high-power lasers to record. Of these, the following embodiment forms a preferred constitution.

The supply of the image-receiving sheet and the thermal transfer sheet is carried out according to fully automatic roll supply. The fixing of the image-receiving sheet and the thermal transfer sheet on the recording drum is carried out by the vacuum attraction. A number of vacuum suction holes are made on the recording drum and the interior of the drum is evacuated with a blower or a vacuum pump to attract the sheets on the drum. Since the thermal transfer sheet is further attracted on the image-receiving sheet attracted, the size of the thermal transfer sheet is larger than that of the image-receiving sheet. Air existing between the thermal transfer sheet and the image-receiving sheet that exerts a largest effect on the recording performance is evacuated only from the area of the thermal transfer sheet outside the image-receiving sheet.

In this apparatus, a number of sheets having a large size like B2 size are placed and piled on a discharge table. Therefor, a method is adopted, by which the air is emitted between two sheets and a sheet discharged later is allowed to float.

Figure 2:
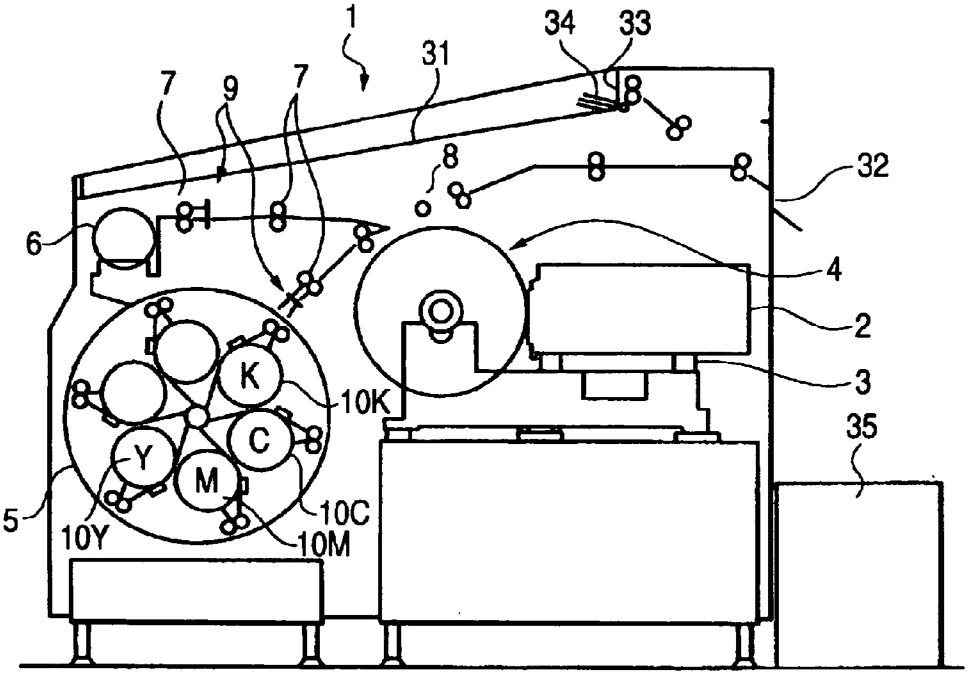
FIG. 2 shows a structure of recording apparatus for laser thermal transfer as an example.

A constitutional example of the apparatus is shown in FIG. 2.

The sequence in the apparatus as described above is illustrated.

1. A sub-scanning shaft of recording head 2 of recording apparatus 1 by sub-scanning rail 3 and a main scanning revolving shaft and thermal transfer sheet loading unit 5 are returned to starting points.

2. Image sheet roll 6 is freed by carrying roller 7, and the tip of the image-receiving sheet fixed on recording drum 4 by evacuation through suction holes provided on the recording drum.

3. Squeeze roller 8 comes down on recording drum 4 and presses down the image-receiving sheet. The image-receiving sheet is further carried by the revolution of the drum, stopped at a point of a specified length, and cut at the point with cutter 9.

4. Recording drum 4 revolves further one round to finish loading of the image-receiving sheet.

5. Subsequently, in the sequence similar to the image-receiving sheet, thermal transfer sheet K of the first color, black, is let out from thermal transfer sheet roll 10K, cut, and loaded.

6. Subsequently, recording drum 4 starts high-speed revolution, recording head 2 on sub-scanning rail 3 starts to move, and when the head reaches a record-starting position, recording drum 4 is irradiated with a recording laser through recording head 2 according to recorded image signals. At a record-finishing position, the irradiation is complete, and the movement of the sub-scanning rail and the revolution of the drum are stopped. The recording head on the sub-scanning rail is returned to the starting point.

7. The image-receiving sheet is left on the recording drum, and only the thermal transfer sheet K is peeled off. The tip of thermal transfer sheet K is torn off with a nib, and the sheet is pulled out in the discharging direction and discarded through discarding opening 32 to discarding box 35.

8. Operations 5 to 7 are repeated as to the residual three colors. Next to black, cyan, magenta, and yellow are recorded in this order. That is, thermal transfer sheet C of the second color "cyan" is let out from thermal transfer sheet roll 10C, thermal transfer sheet M of the third color "magenta" from thermal transfer sheet roll 10M, and thermal transfer sheet Y of the fourth color "yellow" from thermal transfer sheet roll 10Y, successively. Common printing is carried out in the inverse order. The reason for this is that the order of colors becomes inverse on the actual printing paper by transfer to the printing paper in the later process.

9. Lastly, after the four-color printing is complete, the image-receiving sheet recorded is sent to discharge table 31. The method of peeling off the sheet from the drum is the same as item 7 of the thermal transfer sheets. However, different form the thermal transfer sheets, the image-receiving sheet is not discarded. Therefore, after the sheet is carried to discarding opening 32, the sheet is returned to the discharge table by a switchback. When the sheet is discharged on the discharge table, air 34 is emitted from below discharge opening 33 and enables a pile of plural sheets.

For carrying roller 7 of any one of the supply sites or the carrying sites of the thermal transfer sheet roll and the image-receiving sheet roll, use of an adherent roll where an adherent material is provided on the surface thereof is preferable.

The surfaces of the thermal transfer sheet and the image-receiving sheet can undergo cleaning by the adherent roll provided.

Examples of the adherent material provided on the surface of the adherent roll include ethylene/vinyl acetate copolymers, ethylene/ethyl acrylate copolymers, polyolefin resins, polybutadiene resins, styrene/butadiene copolymers (SBR), styrene/ethylene/butene/styrene copolymers (SEBS), acrylonitrile/butadiene copolymers (NBR), polyisoprene resins (IR), styrene/isoprene copolymers (SIS), acrylic ester copolymers, polyester resins, polyurethane resins, acrylic resins, butyl rubber, and polynorbornene.

The adherent roll contacts with the surfaces of the thermal transfer sheet and the image-receiving sheet, thereby the surfaces undergoing cleaning. The contact pressure is not particularly limited as long as the contact is maintained.

It is preferable that the materials having adherence used for the adherent roll have a Vickers hardness Hv of 50 $kg/mm^2$ (about 490 mPa) or less because it can sufficiently remove foreign matter such as dust to depress the occurrence of image defects.

The Vickers hardness is a hardness measured by applying a static load to a pyramid-shaped diamond indenter with an angle between the opposite faces of 136° and is calculated according to the following formula.

Hardness $Hv=1.854P/d^2$ ($kg/mm^2$)≅18.1692 $d^2$ (mPa) Herein, P: Size of load (kg), d: length of diagonal line of dent's square (mm).

In the invention, it is preferable that the adherent materials used for the adherent roll has an elastic modulus of 200 $kg/cm^2$ (≅19.6 mPa ("≅" means "about")) or less at 20° C. because the dust of foreign matter is sufficiently removed to depress the occurrence of the image defects.

It is preferable that an absolute value of the difference between the surface roughness Rz of the image-forming layer's surface and the surface roughness Rz of the back surface of the thermal transfer sheet is 3.0 or less, and an absolute value of the difference between the surface roughness Rz of the image-receiving layer's surface and the surface roughness Rz of back surface in the image-receiving sheet is 3.0 or less. This constitution can prevent the occurrence of the image defects together with the aforesaid means for cleaning, produce no carrying jam, and further improve the stability to dot gain.

In the present specification, the surface roughness Rz means a 10-point average surface roughness corresponding to JIS's Rz (the maximum height). The mean surface of a portion where only a standard area is pulled out from the curved surface of roughness is taken as a standard plane, and a distance of the average value of the heights of mounts of from the highest to the fifth and the average value of the depths of valleys of from the deepest to the fifth is inputted and converted. For measurement, a feeler-type three-dimensional roughness meter produced by Tokyo Seimitsu K.K. (Surfcom 570A-3DF) is used. A longitudinal direction is taken as the direction of the measurement, a cut-off value is 0.08 mm, a measured area is 0.6 mm×0.4 mm, a shift pitch is 0.005 mm, and a measurement speed is 0.12 mm/sec.

It is preferable in view of further improvement in the aforesaid effects that the absolute value of the difference between the surface roughness Rz between the image-forming layer's surface and the surface roughness Rz of the back surface of the thermal transfer sheet is 1.0 or less, and the absolute value of the difference between the surface roughness Rz of the image-receiving layer's surface and the surface roughness Rz of back surface of the image-receiving sheet is 1.0 or less.

In addition, as another embodiment, it is preferable that the surface roughness of the image-forming layer's surface and the back surface of the thermal transfer sheet and the surface and/or the surface roughness Rz of the front and back surfaces of the image-receiving sheet is from 2 to 30 μm. This constitution can prevent the occurrence of the image defects as well as the aforesaid means for cleaning, produce no carrying jam, and further improve the stability to dot gain.

It also is preferable that the glossiness of the image-forming layer of the thermal transfer sheet is from 80 to 99.

The glossiness appreciably depends on smoothness of the image-forming layer's surface and exerts a great effect on uniformity of the thickness of the layer. Higher glossiness is more suitable for the purpose of producing uniform and highly fine images as the image-forming layer, but high smoothness produces appreciable resistance on carrying. Both glossiness and smoothness have a relation of trade-off to each other. The glossiness ranging from 80 to 99 permits the compatibility of both glossiness and smoothness to keep a balance.

Subsequently, an outline of the mechanism of forming the multicolor image by film thermal transfer where a laser is used is illustrated through FIG. 1.

Figure 1B:
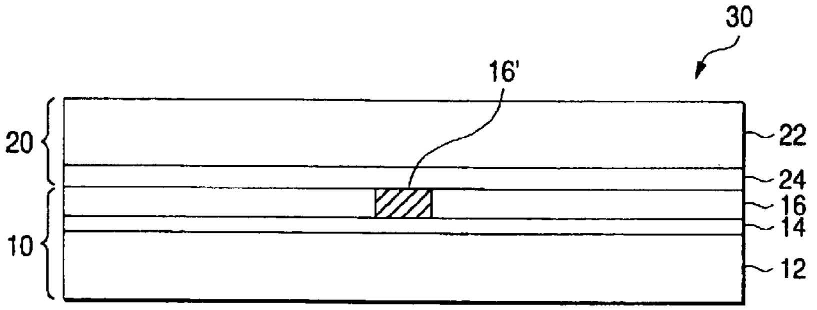
Figure 1C:
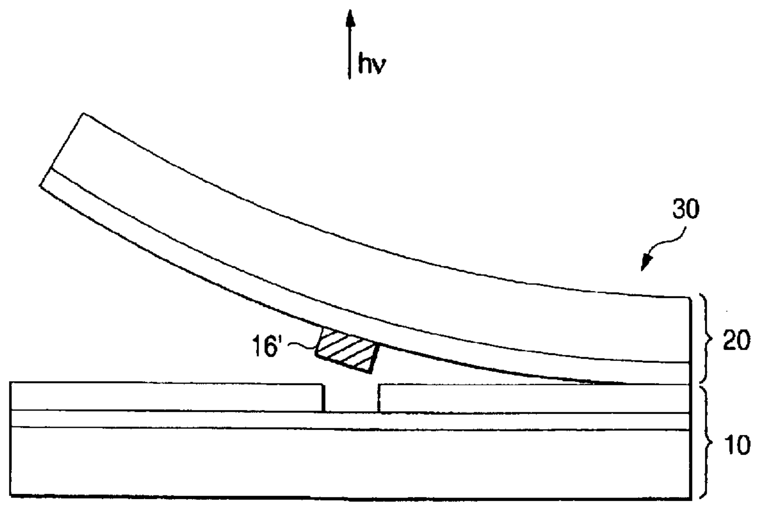

Laminated product for image formation 30 is prepared where image-receiving sheet 20 is superposed on the surface of image-forming layer 16 containing a pigment of black (K), cyan (C), magenta (M), or yellow (Y) of thermal transfer sheet 10. Thermal transfer sheet 10 has support 12, light-to-heat conversion layer 14 thereon, and image-forming layer 16 further thereon. Image-receiving sheet 20 has support 22 and image-receiving layer 24 thereon. Image-forming layer 16 of thermal transfer sheet 10 is superposed on image-receiving layer so as to allow both surfaces thereof to contact (FIG. 1A). When a laser beam is applied from support 12 side of thermal transfer sheet 10 of laminated product 30 like image in time series, areas irradiated with the laser beam in light-to-heat conversion layer 14 of thermal transfer sheet 10 are heated to reduce the adhesive power to image-forming layer 16 (FIG. 1B). Thereafter, when image-receiving sheet 20 is peeled off from thermal transfer sheet 10, area irradiated with the laser beam 16 of image-forming layer 16 is transferred to image-receiving layer 24 of image-receiving sheet 20 (FIG. 1C).

In the multicolor image formation, the laser beam used for irradiation is preferably of multi-beams and particularly preferably of multi-beam two-dimensional arrangement. The multi-beam two-dimensional arrangement means that when recording is carried out by irradiation with a laser beam, a plural number of laser beams are used, and spot arrangement of these laser beams takes a two-dimensional arrangement consisting of plural rows along the main scanning direction and plural lines along the sub-scanning direction.

Use of the laser beams of the multi-beam two-dimensional arrangement can shorten the time taken by laser recording.

Laser beams used are not particularly limited as long as the beams are of multi-beam, and examples thereof include gas laser rays such as an argon ion laser ray, a helium neon laser ray, and a helium cadmium laser ray, solid laser rays such as a YAG laser ray, and direct laser rays such as semiconductor laser rays, dye laser rays, and excimer laser rays. Or half-wave length rays converted from these laser rays by allowing the rays to pass through a secondary higher harmonic device also can be used. In the method for forming the multicolor image, use of the semiconductor laser rays is preferred in view of output power and easiness in modulation. In the method for forming the multicolor image, it is preferable that the laser beams are applied at a condition where a beam diameter on the light-to-heat conversion layer ranges from 5 to 50 $\mu$m (particularly from 6 to 30 $\mu$m). Moreover, the scanning speed is preferably 1 m/sec or more (particularly 3 m/sec or more).

In formation of the multicolor image, the thickness of the image-forming layer of the thermal transfer sheet of black, which is larger than the thicknesses of the image-forming layers of the thermal transfer sheets of yellow, magenta, and cyan, preferably ranges from 0.5 to 0.7 $\mu$m. This makes it possible to inhibit reduction in density depending upon irregularities in transfer when the thermal transfer sheet of black is irradiated with a laser beam.

When the thickness of the image-forming layer in the thermal transfer sheet of black is less than 0.5 $\mu$m, in high energy recording, the image density reduces markedly depending upon irregularities in transfer and in some cases it becomes difficult to achieve an image density required as printing proof. This tendency becomes significant under a highly humid condition to increase change in density depending upon the environment. On the other hand, the thickness exceeding 0.7 $\mu$m causes reduction in transfer sensitivity on laser recording to deteriorate the attachment of small dots or make narrow lines narrower. This tendency is more significant under a lowly humid condition. Or such thickness may cause deterioration in resolving power. The thickness of the image-forming layer in the thermal transfer sheet of black is more preferably from 0.55 to 0.65 $\mu$m and particularly preferably 0.60 $\mu$m.

Furthermore, the thickness of the image-forming layer of the thermal transfer sheet of black is from 0.5 to 0.7 $\mu$m, and the thickness of the image-forming layer of the respective thermal transfer sheets of yellow, magenta, and cyan is preferably 0.2 $\mu$m or more and less than 0.5 $\mu$m.

When the thickness of the image-forming layer of the respective thermal transfer sheets of yellow, magenta, and cyan is less than 0.2 $\mu$m, the reduction in density may occur depending upon irregularities in transfer on laser recording. On the other hand, exceeding 0.5 $\mu$m causes reduction in transfer sensitivity or deterioration in resolving power in some cases. The thickness is more preferably from 0.3 to 0.45 $\mu$m.

The image-forming layer of the thermal transfer sheet of black preferably contains carbon black. The carbon black preferably consists of two or more kinds of carbon black different in coloring power because the reflection density can be adjusted while keeping a P/B (pigment/binder) ratio in a certain range.

The coloring power of carbon black is indicated by various methods. For example, PVC blackness as described in Japanese Patent Laid-Open No. 140033/1998 is exemplified. Evaluation of the PVC blackness is carried out as follows. Carbon black is added to PVC resin and dispersed between two rolls to form a sheet. The blacknesses of carbon black "#40" and "#45" manufactured by Mitsubishi Chemical Corp. are taken as standard values, one point and 10 points, respectively. The blackness of a specimen is evaluated by inspection with the naked eye. Two or more kinds of carbon black different in PVC blackness are appropriately selected and used according to purposes.

Hereinafter, specific processes for preparing the samples are described.

Process for Preparing Samples:

40 mass % of sample carbon black is blended with LDPE (low-density polyethylene) resin by use of a 250-cc Banbury mixer, and kneaded at 115° C. for 4 min.

| Condition of Blending | |
|---|---|
| LDPE resin | 101.89 g |
| Calcium stearate | 1.39 g |
| Irganox 1010 | 0.87 g |
| Sample carbon black | 69.43 g |

Subsequently, carbon black is diluted in a two-roll mill at 120° C. so as to become 1 mass %.

| Condition of Preparation of Diluted Compound: | |
|---|---|
| LDPE resin | 58.3 g |
| Calcium stearate | 0.2 g |
| 40 Mass % carbon black-blended resin | 1.5 g |

The compound is formed into a sheet through a slit width of 0.3 mm, and the sheet is cut into chips and formed into film of 65±3 $\mu$m on a 240° C. hot plate.

In order to form the multicolor image, as described above, a number of image layers (image-forming layers on which images are formed) are repeatedly piled on the same image-receiving sheet by use of the thermal transfer sheets to form a multicolor image, or after images are once formed on image-forming layers of plural image formation sheets, the images are re-transferred to the actual printing paper to form a multicolor image.

In the latter process, for example, the thermal transfer sheets having the image-forming layers that contain coloring materials of hues different from one another are prepared, and four kinds of laminated products for image formation (four colors, cyan, magenta, yellow, and black) are independently prepared by combining the thermal transfer sheets with the image-receiving sheets. The respective laminated products, for example, are irradiated with a laser beam according to digital signals based on an image through color separation filters and then the image-receiving sheets are peeled off from the thermal transfer sheets to form independently the color separation images of the respective colors on the respective image-receiving sheets. Subsequently, the respective color separation images formed are successively laminated on a practical support such as the actual printing paper prepared differently or a support similar to this, thus to form a multicolor image.

In the thermal transfer recording where irradiation with laser beams are utilized, the laser beams are converted into heat, and the image-forming layer containing a pigment is transferred to the image-receiving sheet by making use of the heat energy to form an image on the image-receiving layer. Accordingly, changes in the states of the pigment, coloring matter, or the image-forming layer on transferring are not particularly limited, and all of a solid state, a softened state, a liquid state, and a gas state are included. However, from solid state to softened state are preferred. In the thermal transfer recording by use of irradiation with the laser beams, for example, known melt-type transfer, transfer by abrasion, and sublimation-type transfer also are included.

Of these types, the aforesaid thin film transfer type, and the melt and abrasion types are preferred in view of formation of images of hues similar to an original.

The process for transferring the image-receiving sheet having an image printed on the recording apparatus to the actual printing paper (referred to as the "printing paper") is commonly carried out by use of a heat laminator. Heat and pressure are applied to the image-receiving sheet and the printing paper superposed so as to adhere to each other, and subsequently the image-receiving sheet is peeled off from the printing paper to leave only the image-receiving layer containing the image on the printing paper.

The preceding apparatus is connected to a platemaking system, so that the system exerting function as color proof comes to be built up. The system needs outputting printed products having image qualities as similar as possible to printed matter outputted from the platemaking data from the aforesaid recording apparatus. Herein, software for allowing color and halftone dots to approach those of printed matter is needed. Specific examples of the connection are shown below.

In the case where the proof of printed matter is taken from the platemaking system (e.g., Celebra produced by Fuji Photo FilmCo., Ltd.), the connection of the system is as follows. The CTP (computer to plate) system is connected to the platemaking system. The printing plate outputted from this is applied to a printing machine to obtain final printed matter. Although the aforesaid recording apparatus is connected as the color proof to the platemaking system, the PD system (registered trademark) is placed between these as proof drive software for allowing the color and the halftone dots to approach those of printed matter.

Continuous tone data converted to luster date by the platemaking system are converted to binary data for the halftone dots, outputted to the CTP system, and finally subjected to printing. On the other hand, the identical continuous tone data is outputted also to the PD system. The PD system converts the data received through a four-dimensional (black, cyan, magenta, and yellow) table so that color corresponds to that of the aforesaid printed matter. Last of all, the data are converted to the binary data for the halftone dots so as to correspond to the halftone dots of the aforesaid printed matter, and outputted to the recording apparatus.

The four-dimensional table is experimentally prepared beforehand and stored in the system. The experiment for the preparation is as follows. Of important colors, an image printed through the CTP system and an image outputted from the recording apparatus through the PD system are prepared, and the table is prepared so that the difference between the found values becomes least by comparison.

The thermal transfer sheets and the image-receiving sheet used preferably for the recording apparatus of the aforesaid system are hereinafter described.

[Thermal Transfer Sheet]

The thermal transfer sheet contains at least a light-to-heat conversion layer and an image-forming layer, and further other layers as needed. In the invention either of these layers, particularly preferably the image-forming layer, contains the aforesaid fluorine-series surface active agent. Details about this have been described already.

(Support)

Materials for the support of the thermal transfer sheet are not particularly limited, and a variety of support materials can be used according to purposes. It is preferable that the support has rigidity, dimensional stability, and resistance to heat on forming an image. Preferred examples of the support materials include synthetic resin materials such as polyethylene terephthalate, polyethylene-2,6-naphthalate, polycarbonates, polymethyl methacrylate, polyethylene, polypropylene, polyvinyl chloride, polyvinylidene chloride, polystyrene, styrene/acrylonitrile copolymers, polyamides (aromatic or aliphatic), polyimides, polyamideimides, and polysulfones. Of these materials, biaxially oriented polyethylene terephthalate is preferred in view of mechanical strength and dimensional stability to heat. Herein, for the preparation of the color proof by making use of the laser recording, it is preferable to form the support of the thermal transfer sheet from a transparent synthetic resin material allowing permeation of laser beams. The thickness of the support preferably from 25 to 130 $\mu$m and particularly preferably from 50 to 120 $\mu$m. The central line average surface roughness Ra of the support of the image-forming layer side [measured according to JIS BO601 by use of a surface roughness meter (Surfcom produced by Tokyo Seiki K.K.)] is preferably less than 0.1 $\mu$m. The Young's modulus of the longer direction of the support is preferably from 200 to 1200 kg/mm$^2$ (about from 2 to 12 gPa), and that of the width direction is preferably from 250 to 1600 kg/mm$^2$ (about from 2.5 to 16 gPa). The F-5 value of the longer direction of the support is preferably from 5 to 50 kg/mm$^2$ (about from 49 to 490 mPa), and that of the width direction thereof is preferably from 3 to 30 kg/mm$^2$ (about from 29.4 to 294 mPa). The F-5 value of the longer direction of the support in general is higher than that of the width direction, but particularly when the width direction needs high strength, this rule is not applied. The degree of heat shrinkage of the longer direction and the width direction of the support at 100° C. and 30 min is preferably 3% or less and further preferably 1.5% or less, and that at 80° C. for 30 min is preferably 1% or less and further preferably 0.5% or less. The breakage strength is preferably from 5 to 100 kg/mm$^2$ (about from 49 to 980 mPa) in both directions, and the modulus of elasticity is preferably from 100 to 2000 kg/mm$^2$ (about from 0.98 to 19.6 gPa).

Surface activation treatments and/or formation of one or two or more undercoats can be carried out for the support of the thermal transfer sheet in order to improve the adhesion to the light-to-heat conversion layer provided thereon. Examples of the surface activation treatments include glow discharge and corona discharge. It is preferable that materials for the undercoats have high adhesion to both of the support and the light-to-heat conversion layer, low thermal conductivity, and excellent thermal resistance. Examples of the materials for these undercoats include styrene, styrene/butadiene copolymers, and gelatin. Entire thickness of the undercoats in general is from 0.01 to 2 μm. The surface of the thermal transfer sheet on the opposite side of the light-to-heat conversion layer can be subjected to formation of various functional layers such as an anti-reflection coating and an antistatic layer or surface treatments as needed.

(Back Layer)

Back layers are preferably provided on the surface of the thermal transfer sheet of the invention on the opposite side of the light-to-heat conversion layer. The back layers preferably comprise two layers, the first back layer adjacent to the support and the second back layer provided on the opposite side of the support to the first side. In the invention, a ratio of mass B of an antistatic agent contained in the second back layer to mass A of the antistatic agent contained in the first back layer (B/A) is preferably less than 0.3. The B/A value of 0.3 or more shows a tendency to deteriorate in slip properties and a powder fall from the back layer.

The thickness C of the first back layer is preferably from 0.01 to 1 μm and more preferably from 0.01 to 0.2 μn. The thickness D of the second back layer is preferably from 0.01 to 1 μm and more preferably from 0.01 to 0.2 μm. The ratio between the first and second back layers C:D is preferably from 1:2 to 5:1.

Examples of the antistatic agents used for the first and second back layers include nonionic surface active agents such as polyoxyethylene alkylamines and glycerin aliphatic esters, cationic surface active agents such as quaternary ammonium salts, anionic surface active agents such as alkyl phosphates, amphoteric surface active agents, and compounds such as electrically conductive resins.

Furthermore, electrically-conductive finely-divided particles also can be used as the antistatic agents. Examples of these electrically conductive particles include oxides such as $ZnO$, $TiO_2$, $SnO_2$, $Al_2O_3$, $In_2O_3$, $MgO$, $BaO$, $CoO$, $CuO$, $Cu_2O$, $CaO$, $SrO$, $BaO_2$, $PbO$, $PbO_2$, $MnO_3$, $MoO_3$, $SiO_2$, $ZrO_2$, $Ag_2O$, $Y_2O_3$, $Bi_2O_3$, $Ti_2O_3$, $Sb_2O_3$, $Sb_2O_5$, $K_2Ti_6O_{13}$, $NaCaP_2O_{18}$, and $MgB_2O_5$, sulfides such as $CuS$ and $ZnS$, carbides such as $SiC$, $TiC$, $ZrC$, $VC$, $NbC$, $MoC$, and $WC$, nitrides such as $Si_3N_4$, $TiN$, $ZrN$, $VN$, $NbN$, and $Cr_2N$, borides such as $TiB_2$, $ZrB_2$, $NbB_2$, $TaB_2$, $CrB$, $MoB$, $WB$, and $LaB_5$, silicides such as $TiSi_2$, $ZrSi_2$, $NbSi_2$, $TaSi_2$, $CrSi_2$, $MoSi_2$ and $WSi_2$, metal salts such as $BaCO_3$, $CaCO_3$, $SrCO_3$, $BaSO_4$, and $CaSO_4$, and composites such as $SiN_4$—$SiC$ and $9Al_2O_3$-$2B_2O_3$. These particles can be used singly or as mixtures of two or more thereof. Of these particles, $SnO_2$, $ZnO$, $Al_2O_3$, $TiO_2$, $In_2O_3$, $MgO$, $BaO$, and $MoO_3$are preferred, $SnO_2$, $ZnO$, $In_2O_3$, and $TiO_2$ is further preferred, and $SnO_2$ is particularly preferred.

When the thermal transfer materials of the invention are used for the laser thermal transfer recording system, it is preferable that the antistatic agents used in the back layers are substantially transparent so that the laser beams are allowed to pass through the layers.

When the electrically conductive metal oxides are used as the antistatic agents, smaller particle sizes are preferred so that the light scattering is depressed as lowly as possible, but the particle size should be determined by use of the ratio of refractive indexes between the particle and the binder as a parameter and can be calculated by use of Mie's theory. The average particle size in general ranges from 0.001 to 0.5 μm and preferably ranges from 0.003 to 0.2 μm. Herein, the average particle size is a value where not only first particle sizes of the electrically conductive metal oxide, but also those of higher-order structures are contained.

In addition to the antistatic agents, a variety of additives such as a surface active agent, a lubricant, and a matting agent, and a binder can be contained in the first and second back layers. The amount of the antistatic agent contained in the first back layer is preferably from 10 to 1000 mass parts and further preferably from 200 to 800 mass parts to 100 mass parts of the binder. The amount of the antistatic agent contained in the second layer is preferably from 0 to 300 mass parts and further preferably from 0 to 100 mass parts to 100 mass parts of the binder.

Examples of the binders used for formation of the first and second back layers include homopolymers and copolymers of acrylic acid-series monomers such as acrylic acid, methacrylic acid, acrylic esters, and methacrylic esters, cellulose-series polymers such as nitrocellulose, methyl cellulose, ethyl cellulose, and cellulose acetate, polyethylene polypropylene, polystyrene, vinyl-series polymers and copolymers such as vinyl chloride/vinyl acetate copolymers, polyvinylpyrrolidone, polyvinylbutyral, and polyvinyl alcohol, condensation-series polymers such as polyesters, polyurethanes, and polyamides, rubber-series thermoplastic polymers such as butadiene/styrene copolymers, polymers prepared by polymerizing and crosslinking photopolymerizable and heat-polymerizable compounds such as epoxy compounds, and melamine compounds.

(Light-To-Heat Conversion Layer)

The light-to-heat conversion layer contains a light-to-heat conversion substance, a binder, and a matting agent as needed, and further other components as needed.

The light-to-heat conversion substance is a substance having the function by which light energy applied is converted to heat energy. These substances in general are dyes (including pigments, and so forth) having the ability to absorb laser beams. When image recording is carried out with the aid of infrared laser beams, infrared ray-absorbing dyes are preferably used as the light-to-heat conversion substances. Examples of these dyes include black pigments such as carbon black, pigments of large ring compounds absorbing from visible to near-infrared region such as phthalocyanine and naphthalocyanine, organic dyes used as laser-absorbing materials for high-density lasers recording such as laser disks (cyanine dyes such as indolenine dyes, anthraquinone dyes, azulene dyes, and phthalocyanine dyes), and organometallic compound dyes such as dithiol nickel complexes. Of these dyes, cyanine dyes have high absorptivities, and enable the light-to-heat conversion layer to form as a thinner film when used as the light-to-heat conversion substances. As a result, use of the dyes leads to improvement in the recording sensitivity of the thermal transfer sheet and therefore is preferred.

In addition to the dyes, inorganic materials such as metallic materials in particle form (e.g., blacked silver) also can be used as the light-to-heat conversion materials.

Resins having at least strength to form a layer on the support and high thermal conductivities are preferred as the binders contained in the light-to-heat conversion layer. Furthermore, the resins having heat resistance to the extent of inviting no cleavage by heat generated from the light-to-heat conversion substances on the image recording are preferred because smoothness of the surface of the light-to-heat conversion layer can be maintained even after irradiation with a ray of high energy. Specifically, the resins preferably have a pyrolysis temperature of 400° C. or more and more preferably 500° C. or more [the pyrolysis temperature means a temperature at which mass reduction of 5% is brought about in a stream of the air at a temperature-increasing speed of 10° C./min in TGA method (thermogravimetric analysis)]. Moreover, the binders preferably have a glass transition temperature of from 200 to 400° C. and more preferably from 250 to 350° C. The glass transition temperature less than 200° C. may generate fog in images formed in some cases, and exceeding 400° C. may result in reducing the solubility of the resins and the efficiency of production in some cases.

It is preferable that the heat resistance (e.g., heat deformation temperature or pyrolysis temperature) of the binders of the light-to-heat conversion layer is high as compared with materials for other layers provided over the light-to-heat conversion layer.

Specifically, the preferred resins include acrylic resins such as methyl methacrylate, polycarbonates, polystyrene, vinyl-series resins such as vinyl chloride/vinyl acetate copolymers and polyvinyl alcohol, polyvinylbutyral, polyesters, polyvinyl chloride, polyamides, polyimides, polyether imides, polysulfones, polyether sulfones, aramides, polyurethanes, epoxy resins, and urea/melamine resins. Of these resins, polyimide resins are preferred.

Particularly, polyimide resins represented by the following formulas (I) to (VII), which are soluble in organic solvents, are preferably used because use of these resins permits improvement in productivity of the thermal transfer sheet. Moreover, the resins also are preferred in view of the viscosity stability, the long-term storage, and the humidity resistance of a coating solution for the light-to-heat conversion layer.

(I)

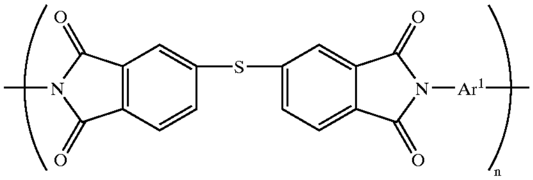

-continued (II)

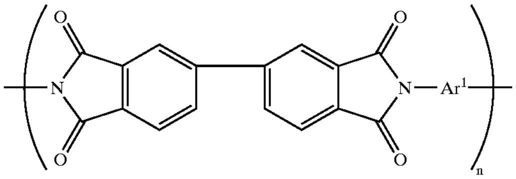

In formulas (I) and (II), $Ar^1$ represents an aromatic group represented by the following structural formulas (1) to (3), and n represents an integer of from 10 to 1000.

(1)

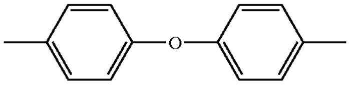

(2)

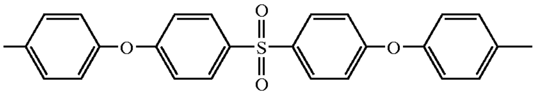

(3)

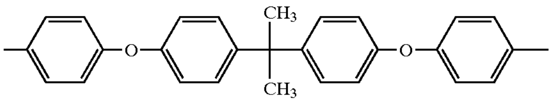

(III)

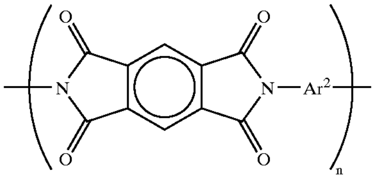

(IV)

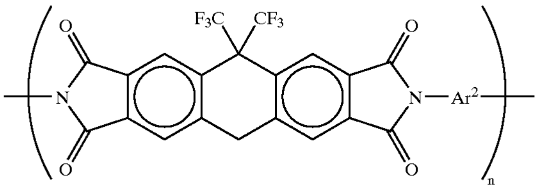

In formulas (III) and (IV), $Ar^2$ represents an aromatic group represented by the following structural formulas (4) to (7), and n represents an integer of from 10 to 100.

(4)

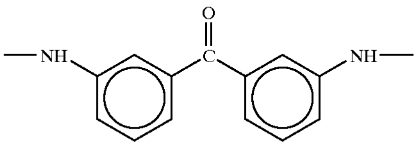

(5)

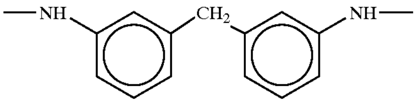

-continued (6)

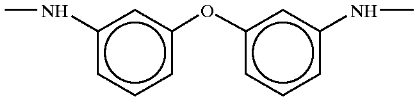

(7)

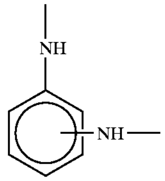

(V)

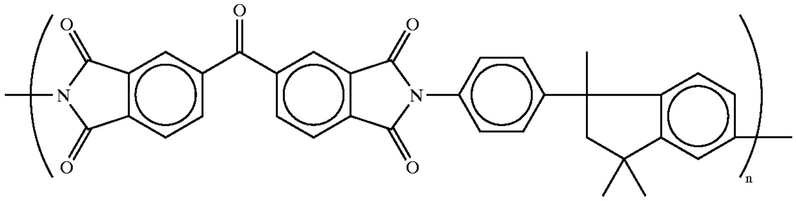

(VI)

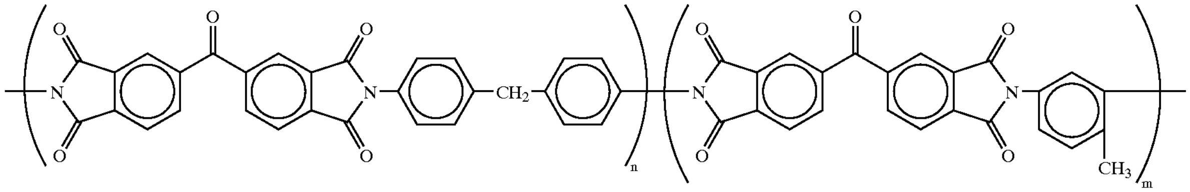

(VII)

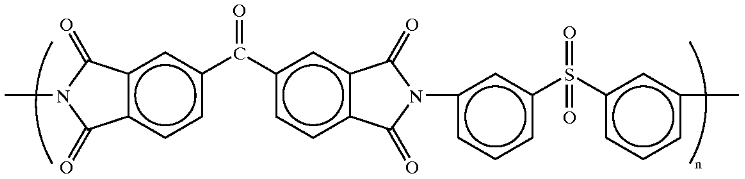

In formula (V) to (VII), n and m each represent an integer of from 10 to 100. In formula (VI), the ratio of n:m is from 6:4 to 9:1.

A criterion to judge whether a resin dissolves in organic solvent or not is whether 10 mass parts or more of the resin dissolve in 100 mass parts of N-methylpyrrolidone at 25° C. or not. When 10 mass parts or more of a resin dissolve, the resin is preferably used as the resin for the light-to-heat conversion resin. More preferred resins are those dissolving in amounts of 100 mass parts or more in 100 mass parts of N-methylpyrrolidone.

The matting agents contained in the light-to-heat conversion layer are inorganic and organic finely divided particles. The inorganic finely divided particles include metal salts such as silica, titanium oxide, aluminum oxide, zinc oxide, magnesium oxide, barium sulfate, magnesium sulfate, aluminum hydroxide, magnesium hydroxide, and boron nitride, and kaolin, clay, talc, zinc white, basic white lead carbonate, zeaklite, quartz, diatomaceous earth, perlite, bentonite, mica, and synthetic mica. The organic finely divided particles include particles of fluororesins, guanamine resins, acrylic resins, styrene/acrylic copolymer resins, silicone resins, melamine resins, and epoxy resins.

The particle size of the matting agents in general is from 0.3 to 30 μm and preferably from 0.5 to 20 μm, and the amount thereof is preferably from 0.1 to 100 $mg/m^2$.

The light-to-heat conversion layer may further contain surface active agents, thickeners, and antistatic agents as needed.

The light-to-heat conversion layer can be provided by dissolving the light-to-heat conversion substance and the binder, adding the matting agent and other components thereto as needed to prepare a coating solution, applying the solution to the support, and drying. Examples of the organic solvents for dissolving the polyimide resins include n-hexane, cyclohexane, diglyme, xylene, toluene, ethyl acetate, tetrahydrofuran, methyl ethyl ketone, acetone, cyclohexane, 1,4-dioxane, 1,3-dioxane, dimethylacetate, N-methyl-2-pyrrolidone, dimethyl sulfoxide, dimethylformamide, dimethylacetamide, γ-butyrolactone, ethanol, and methanol. Coating and drying can be carried out according to known methods, respectively. The drying in general is carried out at a temperature of 300° C. or less and preferably at a temperature of 200° C. or less. When polyethylene terephthalate is used as the support, the drying is preferably carried out at a temperature of from 80 to 150° C.

Too small an amount of the binder in the light-to-heat conversion layer causes reduction in the cohesive power of the light-to-heat conversion layer. When a formed image is transferred to the image-receiving sheet, the light-to-heat conversion layer has a tendency to be transferred together, causing color mixing in the image. Furthermore, too large an amount of the polyimide resin causes increase in thickness of the light-to-heat conversion layer and reduction in sensitivity since a certain absorption factor is required. The mass ratio of solid contents of the light-to-heat conversion substance and the binder in the light-to-heat conversion layer is preferably from 1:20 to 2:1 and particularly preferably from 1:10 to 2:1.

The light-to-heat conversion layer formed into a thin film is preferred because the thermal transfer sheet has high sensitivity as described above. The thickness of the light-to-heat conversion layer is preferably from 0.03 to 1.0 μm and more preferably from 0.05 to 0.5 μm. The light-to-heat conversion layer having an optical density of from 0.80 to 1.26 to the ray of a wavelength of 808 nm preferably brings about improvement in transfer sensitivity of the image-forming layer, and that having an optical density of 0.92 to 1.15 to the ray of the aforesaid wavelength is more preferred. The optical density less than 0.80 at a laser peak wavelength may result in insufficient conversion of light applied to heat, causing reduction in the transfer sensitivity. On the other hand, exceeding 1.26 may exert an effect on the function of the light-to-heat conversion layer to generate fog.

In the invention, the optical density of the light-to-heat conversion layer of the thermal transfer sheet means the extinction exponent of the layer at the peak wavelength of a laser beam used on recording on the materials for forming an image of the invention and can be measured by use of a known spectrophotometer. In the invention, a UV-spectrophotometer UV-240 produced by Shimazu Corp. was used. The optical density meant herein is a value obtained by subtracting the value of the support from the found value.

(Image-Forming Layer)

The image-forming layer contains at least a pigment for forming an image by transfer to the image-receiving sheet, further a binder for forming the layer, and other components if desired.

The pigments in general are classified into organic pigments and inorganic pigments. The former is particularly excellent in transparency of the resulting film and the latter in general is excellent in hiding power, and therefore the pigments can be appropriately selected according to purposes. When the thermal transfer sheet is used for printing color proof, organic pigments corresponding to yellow, magenta, cyan, and black used commonly for printing inks or similar in hues are appropriately used. Moreover, metal powders and fluorescent pigments also are used in some cases. Examples of pigments used appropriately include azo-series pigments, phthalocyanine-series pigments, anthraquinone-series pigments, dioxazine-series pigments, quinacridone-series pigments, isoindolinone-series pigments, and nitro-series pigments. The pigments used for the image-forming layer are classified based on the hues, and exemplified later. However, the pigments usable are not limited to the pigments shown herein.

1. Yellow Pigments

Pigment Yellow 12 (C.I. No. 21090)

Examples: Permanent Yellow DHG (manufactured by Clariant Japan K.K.), Lionol Yellow 1212B (manufactured by Toyo Ink Mfg. Co., Ltd.), Irgalite Yellow LCT (manufactured by Chiba Specialty Chemicals K.K.), and Symuler Fast Yellow GTF 219 (manufactured by Dainippon Ink and Chemicals, Inc.).

Pigment Yellow 13 (C.I. No. 21100)

Examples: Permanent Yellow GR (manufactured by Clariant Japan K.K.) and Lionol Yellow 1313 (manufactured by Toyo Ink Mfg. Co., Ltd.).

Pigment Yellow 14 (C.I. No. 21095)

Examples: Permanent Yellow G (manufactured by Clariant Japan K.K.), Lionol Yellow 1401-G (Toyo Ink Mfg. Co., Ltd.), Seika Fast Yellow 2270 (manufactured by Dainichi Seika Kogyo K.K.), and Symular Fast Yellow 4400 (manufactured by Dainippon Ink and Chemicals, Inc.).

Pigment Yellow 17 (C.I. No. 21105)

Examples: Permanent Yellow GG02 (manufactured by Clariant Japan K.K.) and Symuler Fast Yellow 8GP (manufactured by Dainippon Ink and Chemicals, Inc.).

Pigment Yellow 155

Example: Graphtol Yellow 3GP (manufactured by Clariant Japan K.K.)

Pigment Yellow 180 (C.I. No. 21290)

Examples: Novoperm Yellow P-HG (manufactured by Clariant Japan K.K.) and PV Fast Yellow HG (manufactured by Clariant Japan K.K.).

Pigment Yellow 139 (C.I. No. 56298)

Example: Novoperm Yellow M2R 70 (manufactured by Clariant Japan K.K.).

2. Magenta Pigments

Pigment Red 57:1 (C.I. No. 15850:1)

Examples: Graphtol Rubine L6B (manufactured by Clariant Japan K.K.), Lionol Red 6B-4290G (manufactured by Toyo Ink Mfg. Co., Ltd.), Irgalite Rubine 4BL (manufactured by Chiba Specialty Chemicals K.K.), and Symuler Brilliant Carmine 6B-229 (manufactured by Dainippon Ink and Chemicals, Inc.).

Pigment Red 122 (C.I. No. 73915)

Examples: Hosterperm Pink E (manufactured by Clariant Japan K.K.), Lionogen Magenta 5790 (manufactured by Toyo Ink Mfg. Co., Ltd.), and Fastogen Super Magenta RH (Dainippon Ink and Chemicals, Inc.).

Pigment Red 53:1 (C.I. No. 15585:1)

Examples: Permanent Lake Red LCY (manufactured by Clariant Japan K.K.) and Symuler Lake Red C conc (Dainippon Ink and Chemicals, Inc.).

Pigment Red 48:1 (C.I. No. 15865:1)

Examples: Lionol Red 2B 3300 (manufactured by Toyo Ink Mfg. Co., Ltd.) and Symuler Red NRY (manufactured by Dainippon Ink and Chemicals, Inc.).

Pigment Red 48:2 (C.I. No. 15865:2)

Examples: Permanent Red W2T (manufactured by Clariant Japan K.K.), Lionol Red LX235 (manufactured by Toyo Ink Mfg. Co., Ltd.), and Symuler Red 3012 (manufactured by Dainippon Ink and Chemicals, Inc.).

Pigment Red 48:3 (C.I. No. 15865:3)

Examples: Permanent Red 3RL (manufactured by Clariant Japan K.K.) and Symuler Red 2BS (manufactured by Dainippon Ink and Chemicals, Inc.).

Pigment Red 177 (C.I. No. 65300)

Example: Cromophtal Red A2B (Chiba Specialty Chemicals K.K.).

3. Cyan Pigments

Pigment Blue 15 (C.I. No. 74-160)

Examples: Lionol Blue 7027 (Toyo Ink Mfg. Co., Ltd.) and Fastogen Blue BB (manufactured by Dainippon Ink and Chemicals, Inc.).

Pigment Blue 15:1 (C.I. No. 74160)

Examples: Hosterperm Blue A2R (manufactured by Clariant Japan K.K.) and Fastogen Blue 5050 (manufactured by Dainippon Ink and Chemicals, Inc.).

Pigment Blue 15:2 (C.I. No. 74160)

Examples: Hosterperm Blue AFL (manufactured by Clariant JapanK.K.), Irgalite Blue BSP (manufactured by Chiba Specialty Chemicals K.K.), and Fastogen Blue GP (manufactured by Dainippon Ink and Chemicals, Inc.).

Pigment Blue 15:3 (C.I. No. 74160)

Examples: Hosterperm Blue B2G (manufactured by Clariant Japan K.K.), Lionol Blue FG7330 (Manufactured by Toyo Ink Mfg. Co., Ltd.), Chromophthal Blue 4GNP (manufactured by Chiba Specialty Chemicals K.K.), and Fastogen Blue FGF (manufactured by Dainippon Ink and Chemicals, Inc.).

Pigment Blue 15:4 (C.I. No. 74160)

Examples: Hosterperm Blue BFL (manufactured by Clariant Japan K.K.), Cyanine Blue 700-10FG (manufactured by Toyo Ink Mfg. Co., Ltd.), Irgalite Blue GLNF (manufactured by Chiba Specialty Chemicals K.K.), and Fastogen Blue FGS (manufactured by Dainippon Ink and Chemicals, Inc.).

Pigment Blue 15:6 (C.I. No. 74160)

Example: Lionol Blue ES (manufactured by Toyo Ink Mfg. Co., Ltd.).

Pigment Blue 60 (C.I. No. 69800)

Examples: Hosterperm Blue RL01 (manufactured by Clariant Japan K.K.) and Lionogen Blue 6501 (manufactured by Toyo Ink Mfg. Co., Ltd.)

4. Black Pigments

Pigment Black 7 (Carbon Black C.I. No. 77266)

Examples: Mitsubishi Carbon Black MA100 (Manufactured by Mitsubishi Chemical Corp.), Mitsubishi Carbon Black #5 (manufactured by Mitsubishi Chemical Corp.), and Black Pearls 430 (manufactured by Cabot Co.).

Furthermore, pigments usable in the invention as goods can be appropriately selected by referring to "Ganryo Binran (Handbook of Pigments), Edited by Nippon Ganryo Gijutsu Kyokai, Seibundo Shinkosha, 1989" and "Colour Index, The Society of Dyes & Colourist, Third Edition, 1987."

The average particle size of these pigments is preferably from 0.03 to 1 μm and more preferably from 0.05 to 0.5 μm.

The particle size less than 0.03 μm may invites increase in the cost of dispersion and gelatinization of the dispersion solution in some cases. On the other hand, exceeding 1 μm may cause coarse particles of a pigment to disturb the adhesion between the image-forming layer and the image-receiving layer and moreover to disturb the transparency of the image-forming layer in some cases.

Amorphous organic high polymers having a softening point of from 40 to 150° C. are preferred as the binder of the image-forming layer. Examples of the amorphous organic high polymers include butyral resins, polyamide resins, polyethylene imine resins, sulfonamide resins, polyester polyol resins, petroleum resins, homopolymers and copolymers of styrene, derivative thereof, and substituted compounds thereof such as styrene, vinyltoluene, α-methylstyrene, 2-methylsyrene, chlorostyrene, vinylbenzoic acid, sodium vinylbenzenesulfonate, and aminostyrene, and homopolymers of vinyl-series monomers and copolymers of the monomers with other monomers, monomers which include methacrylic esters such as methyl methacrylate, ethyl methacrylate, butyl methacrylate, and hydroxyethyl methacrylate, and methacrylic acid, acrylic esters such as methyl acrylate, ethyl acrylate, butyl acrylate, and α-ethylhexyl acrylate, and acrylic acid, dienes such as butadiene and isoprene, acrylonitrile, vinyl ethers, maleic acid and maleic esters, maleic anhydride, cinnamic acid, vinyl chloride, and vinyl acetate. These resins can be used as mixtures of two or more thereof.

The image-forming layer contains preferably from 30 to 70 mass % of the pigment and more preferably from 30 to 50 mass % thereof. The image-forming layer contains preferably from 70 to 30 mass % of the resin and more preferably from 70 to 40 mass % thereof.

The image-forming layer can contain the following components 1 to 3 as the other components as described above.

1. Waxes

Waxes include mineral waxes, natural waxes, and synthetic waxes. Examples of the mineral waxes include paraffin waxes, microcrystalline wax, ester waxes, petroleum waxes such as wax oxides, montan wax, ozokerite, and ceresine. Of these waxes, paraffin waxes are preferred. The paraffin waxes are those separated from petroleum and a variety of the waxes different in melting point are commercially available.

Examples of the natural waxes include vegetable waxes such as carnauba wax, Japan wax, auricurry wax, and esparto wax, and animal waxes such as bees wax, insect wax, shellac wax, and spermaceti.

The synthetic waxes in general are used as lubricants and usually consist of higher aliphatic acid-series compounds. Examples of such synthetic waxes include the following waxes.

(1) Aliphatic Acid-Series Waxes

Straight-chained saturated aliphatic acids represented by the following formula:

$$CH_3(CH_2)_nCOOH$$

In the formula, n represents an integer of from six to 28. Examples of the aliphatic acids include stearic acid, behenic acid, palmitic acid, 12-hydroxystearic acid, and azelaic acid.

Moreover, metal salts of these aliphatic acids (e.g., K, Ca, Zn, Mg) are included in the examples.

(2) Aliphatic Ester-Series Waxes

Examples of the aliphatic esters include ethyl stearate, lauryl stearate, ethyl behenate, hexyl behenate, and behenyl myristate.

(3) Aliphatic Amide-Series Waxes

Examples of the aliphatic amides include stearic amide and lauric amide.

(4) Aliphatic Alcohol-Series Waxes

Straight-chained saturated aliphatic alcohols represented by the following formula:

$$CH_3(CH_2)_nOH$$

In the formula, n represents an integer of from six to 28. Examples of the alcohols include stearyl alcohol.

Of the synthetic waxes as described in 1 to 4, stearic amide and lauric amide are particularly suitable. These wax compounds can be used singly or appropriately as mixtures.

2. Plasticizers

The plasticizers are preferably ester compounds, which include known plasticizers: phthalic esters such as dibutyl phthalate, di-n-octyl phthalate, di(2-ethylhexyl)phthalate, dinonyl phthalate, dilauryl phthalate, butyl lauryl phthalate, and butyl benzyl phthalate, aliphatic dibasic acid esters such as di(2-ethylhexyl)adipate and di(2-ethylhexyl)sebacate, phosphoric triesters such as tricresyl phosphate and tri(2-ethylhexyl)phosphate, polyol polyesters such as polyethylene glycol ester, and epoxy compounds such as epoxy aliphatic esters. Of these ester compounds, esters of vinyl monomers, particularly esters of acrylic acid and methacrylic acid, are preferred because the esters have large effects on improvement in transfer sensitivity and transfer irregularity and on adjustment of breaking extension by the addition of these esters.

The ester compounds of acrylic acid and methacrylic acid include polyethylene glycol dimethacrylate, 1,2,4-butanetriol trimethacrylate, trimethylolethane triacrylate, pentaerythritol acrylate, pentaerythritol tetraacrylate, and dipentaerythritol polyacrylate.

The plasticizers can be of polymers. Particularly, the polyesters are preferred because a large effect of the addition thereof and difficulty in diffusion under the conditions of storage. Examples of the polyesters include sebacic acid-series polyesters and adipic acid-series polyesters.

Herein, the additives added to the image-forming layer are not limited to these. The plasticizers can be used singly or as mixtures of two or more thereof.

Too large an amount of the aforesaid additives in the image-forming layer causes reduction in the resolving power of a transfer image, reduction in the film strength of the image-forming layer itself, and transfer of unexposed portions to the image-receiving sheet generated by reduction in the adhesive power between the light-to-heat conversion layer and the image-forming layer in some cases. From this viewpoint, the content of the waxes is preferably from 0.1 to 30 mass % and more preferably from one to 20 mass % of the entire solid content of the image-forming layer. Furthermore, the content of the plasticizers is preferably from 0.1 to 20 mass % and more preferably from 0.1 to 10 mass % of the entire solid content of the image-forming layer.

3. Other Additives

The image-forming layer can contain, as well as the aforesaid components, surface active agents, inorganic or organic finely divided particles (metallic powders, silica gel), oils (linseed oil, mineral oils), thickeners, and antistatic agents. Apart from cases of black images, energy required by transfer can be reduced by adding to the image-forming layer a substance absorbing the wavelength of a light source used for image recording. The substances absorbing the wavelength of the source can be either of the pigment and the dye. For color images, however, use of the sources emitting infrared rays such as a semiconductor laser for image recording and use of dyes absorbing little in the visible region and much in the wavelength of the source are preferable for color reproduction. Examples of the dyes absorbing near-infrared rays include compounds as described in Japanese Patent Laid-Open No. 103476/1991.

The image-forming layer is provided by prepare a coating solution having a pigment and a binder dissolved or dispersed, applying to the light-to-heat conversion layer or a heat-sensitive peel layer (when this layer is provided on the light-to-heat conversion layer), and drying. The solvent used for the preparation of the coating solution includes n-propyl alcohol, methyl ethyl ketone, propylene glycol monomethylether (MFG), methanol, and water. Coating and drying can be carried out according to the common procedures, respectively.

The heat-sensitive peel layer containing a heat-sensitive material can be provided on the light-to-heat conversion layer of the thermal transfer sheet. The heat-sensitive material generates gases or discharges attached water by the action of heat emitted from the light-to-heat conversion layer, thereby to weaken the bond strength between the light-to-heat conversion layer and the image-forming layer. The heat-sensitive materials used herein include compounds (polymers or low molecular compounds) that themselves are decomposed or denatured with the aid of heat to generate gases and compounds (polymers or low molecular compounds) that absorb or adsorb a considerable amount of easily vaporizing substances such as water. These compounds can be used as mixtures.

Examples of the polymers that are decomposed or denatured with the aid of heat to generate gases include self-oxidative polymers such as nitrocellulose, halogen-containing polymers such as chlorinated polyolefin, chlorinated rubber, polychlorinated rubber, polyvinyl chloride, and polyvinylidene chloride, acrylic polymers such as polyisobutyl methacrylate adsorbed by volatile compounds such as water, cellulose esters such as ethyl cellulose adsorbed by volatile compounds such as water, and natural high polymer compounds such as gelatin adsorbed by volatile compounds such as water. Examples of the low molecular compounds that are decomposed or denatured with the aid of heat to generate gases include compounds such as diazo compounds and azide compounds that emit heat and decompose to generate gases.

Herein, the decomposition or denature of the heat-sensitive materials caused by heat as described above preferably occurs at 280° C. or less and particularly preferably at 230° C. or less.

When the low molecular compounds are used as the heat-sensitive materials for the heat-sensitive peel layer, it is desirable to use in combination with a binder. Although polymers themselves that are decomposed or denatured with the aid of heat to generate gases can be used as the binder, common binders having no such characteristics also can be used. In the joint use of the heat-sensitive low molecular compound and the binder, the mass ratio between the former and latter is preferably from 0.02:1 to 3:1 and further preferably from 0.05:1 to 2:1. It is desirable that the heat-sensitive peel layer covers the light-to-heat conversion layer almost all over the surface, and the thickness thereof in general ranges from 0.03 to 1 $\mu$m and preferably from 0.05 to 0.5 $\mu$m.

In the thermal transfer sheet having a structure where the light-to-heat conversion layer, the heat-sensitive peel layer, and the image-forming layer are laminated on the support in this order, the heat-sensitive peel layer is decomposed or denatured by the heat emitted from the light-to-heat conversion layer to generate gases. This decomposition or the generation of gases allows part of the heat-sensitive peel layer to disappear or allows cohesive failure to occur in the heat-sensitive peel layer, thus to reduce the bonding strength between the light-to-heat conversion layer and the image-forming layer. Therefore, part of the light-to-heat conversion layer may adhere to the image-forming layer depending upon behavior of the heat-sensitive peel layer and appear on the surface of the finally formed image to cause color mixing of the image. Accordingly, it is desirable that the heat-sensitive peel layer is not almost colored, that is, the layer shows high transparency to the visible light rays in spite of occurrence of the transfer of the layer so that the color mixing observable by inspection with the naked eye does not appear in the resulting image by the transfer of the layer. Specifically, the extinction modulus of the heat-sensitive peel layer is 50% or less and preferably 10% or less to the visible light rays.

In the thermal transfer sheet, the heat-sensitive materials also can be added to the coating solution for the light-to-heat conversion layer to form the layer without forming independently the heat-sensitive peel layer, and thus the thermal transfer sheet can take constitution having both functions of the light-to-heat conversion layer and the heat-sensitive peel layer.

The coefficient of static friction of the top layer on the image-forming layer side of the thermal transfer sheet is preferably is adjusted to 0.35 or less and more preferably to 0.20 or less. The coefficient of static friction of 0.35 or less of the top layer prevents dirt on rolls on carrying the thermal transfer sheet to enable formation of a high-quality image. The measurement of the coefficient of static friction is carried out according to the method as described in Japanese Patent Application No. 85759/2000 (paragraph [0011]).

The smooster value ("smooster" is a name of a measuring device) of the surface of the image-forming layer is preferably from 0.5 to 50 mmHg (about from 0.0665 to 6.65 kPa) at 23° C.—55% RH and the central line average surface smoothness Ra is preferably from 0.05 to 0.4 $\mu$m. These values depress formation of a number of micro-void at the contact surface between the image-receiving layer and the image-forming layer which prevents both layers from contacting and therefore, are preferred in view of the transfer and moreover the image quality. The Ra values can be measured according to JIS B0601 by use of a surface roughness meter (Surfcom, Produced by Tokyo Seiki K.K.). The surface hardness of the image-forming layer is preferably 10 g or more by use of a sapphire needle. The charge potential of the image-forming layer is preferably from −100 to 100 V after 1 sec after the thermal transfer sheet charged is earthed according to Federal Government Test Standard 4046. The surface resistance of the image-forming layer is preferably $10^9$ Ω or less at 23° C.—55% RH.

Subsequently, the image-receiving sheet used in combination with the aforesaid thermal transfer sheet is illustrated.

[Image-Receiving Sheet]

(Constitution of Layers)

The image-receiving sheet in general comprises a support, one or more image-receiving layers provided on the support, and any one or two or more of a cushion layer, a peel layer, and an intermediate layer provided between the support and the image-receiving layers, if desired. It is preferable to form a back layer on the support on the opposite side of the image-receiving layer in view of carrying properties.

(Support)

The supports include common sheet-like base materials such as plastic sheets, metal sheets, glass sheets, resin-coated paper, paper, and various composites. Examples of the plastic sheets include polyethylene terephthalate sheets, polycarbonate sheets, polyethylene sheets, polyvinyl chloride sheets, polyvinylidene chloride sheets, polystyrene sheets, styrene-acrylonitrile sheets, and polyester sheets. Moreover, the printing paper and coated paper can be used as the paper.

Supports having the minute void preferably contribute to improvement in image quality. These supports can be prepared by forming a mixed melt consisting of, for example, a thermoplastic resin and an inorganic filler or a high polymer filler incompatible with the thermoplastic resin into a single layer or multi-layer film and further stretching uniaxially or biaxially by use of a melt extruder. The void volume is determined by selection of the resin and the filler, the mixing ratio thereof, and the stretching conditions.

Polyolefin resins such as polypropylene and polyethylene terephthalate resins are preferred as the thermoplastic resins because of good crystallizability, good stretching properties, and easy formation of the void. Joint use of the polyolefin resin or the polyethylene terephthalate resin as a main component and an appropriately small amount of another thermoplastic resin is preferred. The inorganic pigments used as the fillers preferably have an average particle size of from 1 to 20 $\mu$m and include calcium carbonate, clay, diatomaceous earth, titanium oxide, aluminum hydroxide, and silica. When polypropylene is used as the thermoplastic resin, polyethylene terephthalate is preferred as the incompatible resin used as the filler in combination with the polypropylene. Details of the support having the minute void are described in Japanese Patent Application No. 290570/1999.

The content of the fillers such as the inorganic pigments in the support in general is from 2 to 30% in volume.

The thickness of the support of the image-receiving sheet in general is from 10 to 400 $\mu$m and preferably from 25 to 200 $\mu$m. The surface of the support can be subjected to surface treatment such as corona discharge or glow discharge in order to heighten the adhesion to the image-receiving layer (or the cushion layer) or the adhesion to the image-forming layer of the thermal transfer sheet.

(Image-Receiving Layer)

For transfer and fixing of the image-forming layer, one or more image-receiving layers are preferably provided on the support of the image-receiving sheet. The image-receiving layers are preferably layers formed principally from organic polymer binders. The binders are preferably of thermoplastic resins and examples thereof include homopolymers and copolymers of acrylic monomers such as acrylic acid, methacrylic acid, acrylic esters, and methacrylic esters, cellulose-series polymers such as methyl cellulose, ethyl cellulose, and cellulose acetate, homopolymers and copolymers of vinyl-series monomers such as polystyrene, polyvinylpyrrolidone, polyvinylbutyral, polyvinyl alcohol, polyvinyl chloride, half-esterified products of styrene/maleic acid copolymers, half-esterified products of styrene/fumaric acid copolymers, and esterified products of styrene/acrylic acid copolymers, condensation-series polymers such as polyesters and polyamides, and rubber-series polymers such as butadiene/styrene copolymers.

Of these thermoplastic resins, at least one selected from polyvinylbutyral or half-esterified products of styrene/maleic acid copolymers, half-esterified products of styrene/fumaric acid copolymers, and esterified products of styrene/acrylic acid copolymers is preferably used as the polymer binder.

These binder polymers can be used in combination of two or more thereof. At least one selected from polyvinylbutyral or half-esterified styrene/maleic acid copolymers, half-esterified styrene/fumaric acid copolymers, and esterified products of styrene/acrylic acid copolymers preferably accounts for 10 mass % or more and particularly preferably 30 mass % or more of the binder polymers used.

The binders for the image-receiving layer preferably are polymers having a glass transition temperature (Tg) lower than 90° C. in order to acquire an appropriate adhesive power to the image-forming layer. For this purpose, a plasticizer can be added to the image-receiving layer. Furthermore, in order to prevent blocking between the sheets, the binder polymer preferably has a Tg of 30° C. or more. It is particularly preferable to use the same polymers as or polymers similar to the binder polymers for the image-forming layer as the binder polymers for the image-receiving layer in view of improvement in adhesion to the image-forming layer on laser recording and improvement in sensitivity and image strength.

The smooster value of the surface of the image-receiving layer is preferably from 0.5 to 50 mmHg (about from 0.0665 to 6.65 kPa) at 23° C.—55% RH, and the central line average surface roughness Ra thereof is preferably from 0.05 to 0.4 $\mu$m. These values depress the formation of a number of micro void at the contact surface between the image-receiving layer and the image-forming layer which prevents both layers from contacting and therefore are preferred in view of the transfer and moreover the image quality. The Ra value can be measured according to JIS B0601 by use of a surface roughness meter (Surfcom, produced by Tokyo Seiki K.K.). The charge potential of the image-receiving layer is preferably from −100 to 100 V after one sec after the image-receiving layer charged is earthed according to Federal Government Test Standard 4046. The surface resistance of the image-receiving layer is preferably $10^9$ Ω or less at 23° C.—55% RH. The coefficient of static friction of the surface of the image-receiving layer is preferably 0.8 or less. The surface energy of the image-receiving layer is preferably from 23 to 35 mg/m$^2$.

When an image is once formed on the image-receiving layer and subsequently re-transferred to the printing paper, etc., it also is preferred to form at least one of image-receiving layers from a photocurable material. A composition of the photocurable material include, for example, a combination of a photo-polymerizable monomer consisting of at least one of polyfunctional vinyl or vinylidene compounds that can form a photopolymer by addition polymerization (a), an organic polymer (b), a photopolymerization intiator (c), and additives such as a thermal polymerization inhibitor as needed. The polyfunctional vinyl monomer used include unsaturated esters of polyols, particularly acrylic or methacrylic esters (e.g., ethylene glycol diacrylate and pentaerythritol tetraacrylate).

The organic polymers include the aforesaid polymers for forming the image-receiving layer. As the photopolymerization initiators, ordinary photo-radical polymerization initiators such as benzophenone and Michler's ketone are used in a ratio of from 0.1 to 20 mass % in the layer.

The thickness of the image-receiving layer is from 0.3 to 7 $\mu$m and preferably from 0.7 to 4 $\mu$m. The thickness less than 0.3 $\mu$m frequently brings about poor layer strength to cause easy breakage on re-transferring to the printing paper. Too thick a layer results in increasing the luster of an image on re-transferring to the printing paper to deteriorate the similarity to printed matter.

(Other Layers)

A cushion layer is preferably provided between the support and the image-receiving layer. The setting of the cushion layer increases the adhesion between the image-forming layer and the image-receiving layer on laser thermal transfer to improve the image quality. When foreign matter invades between the thermal transfer sheet and the image-receiving sheet on recording, the deformation action of the cushion layer reduces the void between the image-receiving layer and the image-forming layer, resulting in reducing the image defect size such as clear. Furthermore, when an image formed by transfer is re-transferred to the printing paper, the image-receiving surfaces thereof is deformed according to unevenness of the paper to improve the properties of transferring of the image-receiving layer and in addition reduction in luster of the matter transferred also leads to improvement in similarity to printed matter.

The cushion layer has a structure undergoing easily deformation according to stress applied to the image-receiving layer, and in order to achieve the aforesaid effects, is preferably made of materials with low elastic moduli, materials with rubber elasticity, or thermoplastic resins easily softened with the aid of heat. The elastic modulus of the cushion layer at room temperature is preferably from 0.5 mPa to 1.0 gPa, more preferably from 1 mPa to 0.5 gPa, and most preferably from 10 to 100 mPa. The penetration depth according to JIS K2530 (25° C., 100 g, 5 sec) is preferably 10 or more in order to sink the foreign matter such as dust into the layer. The glass transition temperature of the cushion layer is 80° C. or less and preferably 25° C. or less, and the softening point thereof is preferably from 50 to 200° C. In order to adjust these physical properties, for example, the glass transition temperature Tg, addition of a plasticizer to a binder for the layer is appropriately carried out.

Specific materials used as the binders for the cushion layer include polyethylene, polypropylene, polyesters, styrene/butadiene copolymers, ethylene/vinyl acetate copolymers, ethylene/acrylic copolymers, vinyl chloride/vinyl acetate copolymers, vinylidene chloride resins, plasticizer-containing vinyl chloride resins, polyamide resins, and phenol resins as well as rubber such as urethane rubber, butadiene rubber, nitrile rubber, acrylic rubber, and natural rubber.

Although the thickness of the cushion layer varies depending upon resins used and other conditions, the thickness in general from 3 to 100 $\mu$m and preferably from 10 to 52 $\mu$m.

The image-receiving layer and the cushion layer are required to adhere to each other until the laser recording is achieved, and preferably designed to be able to peel off from each other in order to re-transfer the image to the printing paper. In order to promote peeling, it is preferable to provide a peel layer of a thickness of from about 0.1 to about 2 $\mu$m between the cushion layer and the image-receiving layer. Too large a thickness of the peel layer makes it difficult to exercise the performance of the cushion layer and therefore, it is necessary to adjust the thickness according to the kinds of the peeling layer.

Examples of binders for the peel layer include polyolefin, polyesters, polyvinylacetal, polyvinylformal, polyparabanic acid, polymethylmethacrylate, polycarbonates, ethyl cellulose, nitrocellulose, methyl cellulose, carboxymethyl cellulose, hydroxypropyl cellulose, polyvinyl alcohol, polyvinyl chloride, urethane resins, fluororesins, styrenes such as polystyrene and acrylonitrile styrene and these resins crosslinked, and thermosetting resins having a Tg of 65° C. or more of polyamides, polyimides, polyether imides, polysulfones, polyether sulfones, and paramides and cured products of these resins. Common curing agents such as isocyanate and melamine can be used as the curing agents.

Polycarbonates, acetal, and ethyl cellulose are preferably selected as the binders for the peel layer satisfying the aforesaid physical properties in view of shelf stability. Use of acrylic resins for the image-receiving layer is particularly preferred because of good peeling properties shown on re-transferring the image after laser thermal transfer.

Different from these peel layers, a layer that reduces markedly the adhesion to the image-receiving layer when cooled also serves as a peel layer. Specific examples are layers containing as principal components heat melt compounds such as waxes and binders and thermoplastic resins.

As the heat melt compounds there are substances as described in Japanese Patent Laid-Open No. 193886/1988. Microcrystalline wax, paraffin wax, and carnauba wax are particularly preferably used. The thermoplastic resins used preferably are ethylene-series copolymers such as ethylene-vinyl acetate resins and cellulose-series resins.

Additives that can be added as needed to these peel layers are higher aliphatic acids, higher alcohols, higher aliphatic esters and amides, and higher amines.

Peel layers having another constitution are those acquiring peeling properties by melting or softening on heating to cause cohesive failure of the layer itself. It is preferable that these peel layers contain supercooling substances.

The supercooling substances include poly-$\epsilon$-caprolactone, polyoxyethylene, benzotriazole, tribenzylamine, and vanillin.

Peel layers having the other constitution contain compounds to reduce the adhesion to the image-receiving layer. Examples of these compounds include silicone-series resins such as silicone oils, fluororesins such as Teflon and fluorine-containing acrylic resins, polysiloxane resins, acetal-series resins such as polyvinylbutyral, polyvinylacetal, and polyvinylformal, solid waxes such as polyethylene wax and amide waxes, and fluorine-series and phosphoric ester-series surface active agents.

As a method for forming the peel layer, coating with a blade coater, a roll coater, a bar coater, a curtain coater, or a gravure coater or extrusion lamination by use of hot melt is performed by use of a solution prepared by dissolving the materials in solvent or latex prepared by dispersing the materials to form the peel layer on the cushion layer. Or as another method, a solution prepared by dissolving the materials in solvent or latex prepared by dispersing the materials is coated on a temporary base according to the aforesaid method and laminated to the cushion layer, and thereafter the temporary base is peeled off from the laminated product to form a peel layer.

The image-receiving sheet combined with the thermal transfer sheet can have a structure where the image-receiving layer also serves as the cushion layer. In this case, the image-receiving sheet can be of a structure of support/image-receiving layer having cushion properties or a structure of support/under coat/image-receiving layer having cushion properties. Herein it is preferable to design the image-receiving layer having cushion properties to be able to peel off, so that the re-transfer to the printing paper becomes possible. In this case, an image re-transferred to the printing paper is excellent in luster.

The thickness of the image-receiving layer having cushion properties is from 5 to 100 μm and preferably from 10 to 40 μm.

It is preferable to form a back layer on the support of the image-receiving sheet on the opposite side of the image-receiving layer because of improvement in carrying properties of the image-receiving sheet. Surface active agents, antistatic agents such as finely divided particles of tin oxide, and matting agents such as silicon oxide and PMMA particles are added to the back layer preferably in view of improvement in carrying properties of the image-receiving sheet within the recording apparatus.

The additives can be added not only to the back layer, but also to the image-receiving layer and other layers as needed. Although the additives of some kinds cannot be unqualifiedly determined depending upon purposes, for example, in the matting agents, particles having average particle sizes of from 0.5 to 10 μm can be added in an amount of from about 0.5 to about 80% into the layers.

The antistatic agent is appropriately selected from various surface active agents and electrically conductive agents, so that the surface resistance of layer is $10^{12}$ Ω or less and more preferably $10^{9}$ Ω or less at 23° C.—50% RH.

The binders used for the back layer are polymers used commonly including gelatin, polyvinyl alcohol, methyl cellulose, nitrocellulose, acetyl cellulose, aromatic polyamide resins, silicone resins, epoxy resins, alkyd resins, phenol resins, melamine resins, fluororesins, polyimide resins, urethane resins, acrylic resins, urethane-modified silicone resins, polyethylene resins, polypropylene resins, polyester resins, Teflon resins, polyvinylbutyral resins, vinyl chloride-series resins, polyvinyl acetate, polycarbonates, organoboron compounds, aromatic esters, fluorinated polyurethane, and polyether sulfones. When a water-soluble binder being capable of crosslinking is used as the binder of the back layer and subjected to crosslinking, use of the water-soluble binder has an effect on the prevention of a powder fall from a matting agent and improvement in flaw resistance of the back layer and furthermore, exerts a great effect on the prevention of blocking during the storage.

For the crosslinking, any one of heat, an active ray, and pressure or a combination thereof can be adopted without limitation according to the characteristics of a crosslinking agent used. In some cases, in order to impart the adhesion to the support, an arbitrary adhesive layer can be provided on the side of the back layer to be provided of the support.

The matting agents added preferably to the back layer are organic or inorganic finely divided particles. The organic matting agents include finely divided particles of radical polymerization-series polymers such as polymethyl methacrylate (PMMA), polystyrene, polyethylene, polypropylene, and the like, and finely divided particles of condensation polymers such as polyesters and polycarbonates.

The amount of the back layer formed is preferably from about 0.5 to about 5 $g/m^2$. The amount less than 0.5 $g/m^2$ causes unstable coating, frequently to encounter problems such as a powder fall of the matting agent. Largely exceeding 5 $g/m^2$ invites great increase in suitable particle size of the matting agent to produce an embossment on the surface of the image-receiving layer caused by the back layer during storage. Particularly, in the thermal transfer where the image-forming layer consisting of thin film is transferred, clears and unevenness in recorded images frequently develop.

The number average particle size of the matting agent is preferably from 2.5 to 20 μm larger than the thickness of only the binder of the back layer. About the matting agent, particles having sizes of 8 μm or more need to be 5 $mg/m^2$ or more and preferably from 6 to 600 $mg/m^2$, thereby to prevent particularly faults caused by foreign matter. Furthermore, when particles narrow in particle size distribution wherein a value obtained by dividing the standard deviation of the particle size distribution by the number average particle size, σ/rn (coefficient of variation of particle size distribution), is 0.3 or less are used, defects caused by particles having abnormally large particle sizes can be improved and moreover, desired performance is achieved by addition of a smaller amount thereof. The coefficient of variation is more preferably 0.15 or less.

Addition of the antistatic agents to the back layer is preferred in order to prevent the attachment of foreign matter caused by frictional charge with the carrying rolls. As well as cationic surface active agents, anionic surface active agents, nonionic surface active agents, high polymer antistatic agents, and electrically conductive finely divided particles, compounds as described in "11290 no kagaku shohin" (11,290 Chemical Goods), Kagakukogyonipposha, p. 875 to 876 can be widely used.

Of these substances, the antistatic agents used preferably for the back layer include carbon black, metal oxides such as zinc oxide, titanium oxide, and tin oxide, and electrically conductive finely divided particles of organic semiconductors. Particularly, use of the electrically conductive finely divided particles is preferred to achieve a stable antistatic effect without separation of the antistatic agent from the back layer and without dependence on environmental conditions.

Moreover, it is possible to add to the back layer a lubricant such as various active agents, silicone oils, and fluororesins to impart coating properties and lubricating properties.

The back layer is particularly preferred when the softening points of the cushion layer and the image-receiving layer measured according to TMA (thermomechanical analysis) are 70° C. or less.

The TMA softening point is found by observing the phase of an object to be measured while applying a constant load to the object at a constant temperature-increasing speed. In the invention, the TMA softening point is defined as a temperature at which the phase of the object starts to change. The measurement of the softening point through the TMA can be carried out by use of apparatus such as a Thermoflex produced by Rigaku Denki K.K.

The thermal transfer sheet and the image-receiving sheet are used for image formation as a laminated product where both sheets are superposed so that the image-forming layer of the thermal transfer sheet and the image-receiving layer of the image-receiving sheet face each other.

The laminated product of the thermal transfer sheet and the image-receiving sheet can be prepared according to a variety of methods. For example, both sheets superposed so that the image-forming layer contacts with the image-receiving layer are allowed to pass between press and heat rollers to prepare the laminated product with ease. In this case, the temperature is 160° C. or less and preferably 130° C. of less.

As another method for preparing the laminated product, the aforesaid method of vacuum adhesion also is preferably used. In this method, first the image-receiving sheet is wound onto a drum having suction holes for evacuation and subsequently the thermal transfer sheet having a size slightly larger than the image-receiving sheet is subjected to vacuum adhesion onto the image-receiving sheet while forcing out the air through a squeeze roller. As the other method, the image-receiving sheet is mechanically spread out on a metallic drum while stretching, and similarly the thermal transfer sheet also is mechanically spread out on the image-receiving sheet while stretching to allow adhesion to each other. Of these methods, the method of vacuum adhesion is particularly preferred because the temperature control of heat rollers is unnecessary and rapid and uniform lamination is easily carried out.

EXAMPLES

Examples of the invention are illustrated below, but the invention is not to be construed as limited by the examples. Herein, “parts” means “mass parts” unless otherwise noted.

Examples 1-1 to 1-9 and Comparative Examples 1-1 and 1-2

Preparation of Thermal Transfer Sheet K (Black):

[Formation of Back Layer]

| [Preparation of Coating Solution for First Back Layer] | |
|---|---|
| Aqueous dispersion of acrylic resin (Jurimer ET410, Solid content: 20 mass %, Manufactured by Nippon Jun-yaku K.K.) | 2 parts |
| Antistatic agent (Aqueous dispersion of tin oxide and antimony oxide) (Average particle size: 0.1 μm, 17 mass %) | 7.0 parts |
| Polyoxyethylene phenyl ether | 0.1 part |
| Melamine compound (Sumichix Resin M-3, Manufactured by Sumitomo Chemical Co., Ltd.) | 0.3 part |
| To 100 parts in total with Distilled Water | |

[Formation of First Back Layer]

One surface (back surface) of a biaxially oriented polyethylene terephthalate support (Ra’s of both surfaces: 0.01 μm) of a 75-μm thickness was subjected to corona treatment, coated with the coating solution for the first back layer so as to be 0.03 μm in thickness of the dried layer, and dried at 180° C. for 30 sec to form the first back layer. The Young’s modulus of the support was 450 $kg/mm^2$ (about 4.4 gPa) in the longer direction and 500 $kg/mm^2$ (about 4.9 gPa) in the width direction. The F-5 value of the support was 10 $kg/mm^2$ (about 98 mPa) in the longer direction and 13 $kg/mm^2$ (about 127.4 mPa) in the width direction. The degree of heat shrinkage of the support at 100° C. and 30 min was 0.3% in the longer direction and 0.1% in the width direction. The breakage strength was 20 $kg/mm^2$ (about 196 mPa) in the longer direction and 25 $kg/mm^2$ (about 245 mPa) in the width direction. The modulus of elasticity was 400 $kg/mm^2$ (about 3.9 gPa).

| [Preparation of Coating Solution for Second Back Layer] | |
|---|---|
| Polyolefin (Chemipearl S-120, 27 mass %, Manufactured by Mitsui Petrochemical Ind. Ltd.) | 3.0 parts |
| Antistatic agent (Aqueous dispersion of tin oxide and antimony oxide) (Average particle size: 0.1 μm, 17 mass %) | 2.0 parts |
| Colloidal silica (Snowtex C, 20 mass %, Manufactured by Nissan Chemical Industries, Ltd.) | 2.0 parts |
| Epoxy compound (Dinacole EX-614B, Manufactured by Nagase Kasei K.K.) | 0.3 part |
| To 100 parts in total with Distilled Water | |

[Formation of Second Back Layer]

The coating solution for the second back layer was coated on the first back layer so as to be 0.03 μm in thickness of a dried layer and dried at 170° C. for 30 sec to form a second back layer.

1. Preparation of Coating Solution for Light-To-heat Conversion Layer

The following components are mixed with stirring to prepare the coating solution for the light-to-heat conversion layer.

| [Composition of Coating Solution for Light-to-heat Conversion Layer] | |
|---|---|
| Infrared ray-absorbing dye (NK-2014, Manufactured by Nippon Kankoshikiso K. K., Cyanine dye having the following structure) | 7.6 parts |

-continued

| [Composition of Coating Solution for Light-to-heat Conversion Layer] | |
|---|---|
| 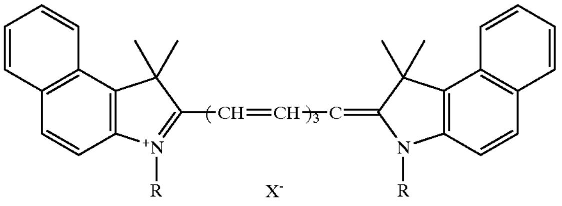 | |
| (In the formula, R represents $CH_3$, and $X^-$ represents $ClO_4^-$.) | |
| Polyimide resin having the following structure (Rikacoat SN-20F, Manufactured by New Japan Chemical Co., Ltd. Decomposition temperature: 510° C.) | 29.3 parts |
| 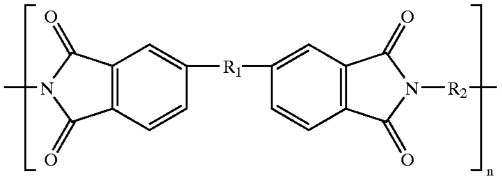 | |
| (In the formula, $R_1$ represents $SO_2$, $R_2$ represents | |
| 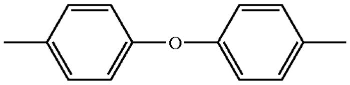 | |
| or | |
| 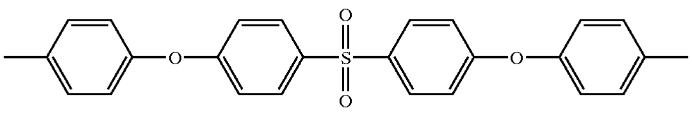 | |
| and n represents) | |
| Exxon Naphtha | 5.8 parts |
| N-Methylpyrrolidone (NMP) | 1500 parts |
| Methyl ethyl ketone | 360 parts |
| Surface active agent (Megafack F-176PF, Manufactured by Dainippon Ink and Chemicals, Inc., F-series surface active agent) | 0.5 part |
| Matting agent dispersion having the following composition | 14.1 parts |
| Matting Agent Dispersion | |
| N-Methyl-2-pyrrolidone (NMP) | 69 parts |
| Methyl ethyl ketone | 20 parts |
| Styrene acrylic resin (Johncryl 611, Manufactured by Johnson Polymer K. K.) | 3 parts |
| $SiO_2$ particle (Seafoster kEP150, Manufactured by Nippon Shokubai Co., Ltd.) | 8 parts |

2. Formation of Light-To-Heat Conversion Layer on Support's Surface

The coating solution for the light-to-heat conversion layer was coated on a surface of polyethylene terephthalate film (support) of 75-μm thickness by use of a wire bar and dried in a 120° C. oven for two min, thus to form a light-to-heat conversion layer on the support. The optical density of the resulting layer at a wavelength of 808 nm was measured with a UV-spectrophotometer UV-240 produced by Shimazu Corp. and found to be 1.03. The thickness of the layer was found to be 0.3 μm on average by observing the section of the layer under a scanning electron microscope.

3. Preparation of Coating Solution for Black Image-Forming Layer

The following components were placed in a kneader mill and a pretreatment for dispersion was carried out by applying the shear force while adding a small amount of solvent. The solvent was further added to the dispersion so as to achieve finally the following composition. Sand mill disper sion was carried out for two hr to prepare a mother liquid for pigment dispersions.

| [Composition of Mother Liquid for Black Pigment Dispersion] | |
|---|---|
| Composition 1: | |
| Polyvinylbutyral (Ethleck B BL-SH, Manufactured by Sekisui Chemical Co., Ltd.) | 12.6 parts |
| Pigment Black 7 (Carbon Black C. I. No. 77266) (Mitsubishi Carbon Black #5, Manufactured by Mitsubishi Chemical Corp., PVC blackness: 1) | 4.5 parts |
| Dispersing agent (Solsperse S-20000, Manufactured by ICI K.K.) | 0.8 part |
| n-Propyl alcohol | 79.4 parts |
| Composition 2: | |
| Polyvinylbutyral (Ethleck B BL-SH, Manufactured by Sekisui Chemical Co., Ltd.) | 12.6 parts |
| Pigment Black 7 (Carbon Black C. I. No. 77266) (Mitsubishi Carbon Black MA100, Manufactured by Mitsubishi Chemical Corp., PVC Blackness: 10) | 10.5 parts |
| Dispersion agent (Solsperse S-20000, Manufactured by ICI K.K.) | 0.8 part |
| n-Propyl alcohol | 79.4 parts |

Subsequently, the following components are mixed with stirring to prepare a coating solution for the black image-forming layer.

| [Composition of Coating Solution for Black Image Formation Layer] | |
|---|---|
| Mother liquids for black pigment dispersion (Composition 1: Composition 2 = 70:30 in parts) | 185.7 parts |
| Polyvinylbutyral (Ethleck B BL-SH, Manufactured by Sekisui Chemical Co., Ltd.) | 11.9 parts |
| Wax Compounds | |
| (Stearic amide, Neutron 2, Manufactured by Nippon Fine Chemical Co., Ltd.) | 1.7 parts |
| (Behenic amide, Diamid BM, Manufactured by Nippon Kasei Chemical Co., Ltd.) | 1.7 parts |
| (Lauric amide, Diamid Y, Manufactured by Nippon Kasei Chemical Co., Ltd.) | 1.7 parts |
| (Palmitic amide, Diamid KP, Manufactured by Nippon Kasei Chemical Co., Ltd.) | 1.7 parts |
| (Erucic amide, Diamid L-200, Manufactured by Nippon Kasei Chemical Co., Ltd.) | 1.7 parts |
| (Oleic amide, Diamid O-200, Manufactured by Nippon Kasei Chemical Co., Ltd.) | 1.7 parts |
| Rosin (KE-311, Manufactured by Arakawa Chemical Industry Co., Ltd.) (Components: Resin acids: 80 to 97%, Resin acid components: Abietic acid: 30 to 40%, Neoabietic acid: 10 to 20%, Dihydroabietic acid: 14%, Tetrahydroabietic acid: 14%) | 11.4 parts |
| Surface active agent (Compounds as described in Table 1) | 1.5 parts |
| Inorganic Pigment (MEK-ST, 30% Methyl ethyl ketone solution, Manufactured by Nissan Chemical Industries, Ltd.) | 7.1 parts |
| n-Propyl alcohol | 1050 parts |
| Methyl Ethyl Ketone | 295 parts |

Particles in the resulting coating solution for the black image-forming layer were measured by use of a particle size distribution instrument of laser-scattering system. The average particle size was 0.25 μm, and the ratio of the particles having sizes of 1 μm or more was 0.5%.

4. Formation of Black Image-Forming Layer on Light-To-Heat Conversion Layer

The coating solution for the black image-forming layer was coated on the surface of the light-to-heat conversion layer by use of a wire bar for one min, and the coated product was dried in a 100° C. oven for two min to form a black image-forming layer on the light-to-heat conversion layer. A thermal transfer sheet where the light-to-heat conversion layer and the black image-forming layer were provided on the support in this order was prepared according to this process (This sheet is hereinafter referred to as the thermal transfer sheet K. Similarly, the sheet where a yellow image-forming layer is provided is described as a thermal transfer sheet Y, the sheet where a magenta image-forming layer is provided is described as a thermal transfer sheet M, and the sheet where a cyan image-forming layer is provided is described as a thermal transfer sheet C.) The optical density of the black image-forming layer of the thermal transfer sheet K was measured with a Macbeth densitometer TD-904 (W filter) and found to be 0.91. The thickness of the black image-forming layer was measured and found to be 0.60 μm on average.

The physical properties of the resulting image-forming layer were as follows.

The surface hardness of the layer is preferably 10 g or more by use of a sapphire needle, and specifically was found to be 200 g or more.

The smooster value of the surface is preferably from 0.5 to 50 mmHg (about from 0.0665 to 6.65 kPa) at 23° C.—55% RH, and specifically was found to be 9.3 mmHg (about 1.24 kPa).

The coefficient of static friction of the surface is preferably 0.2 or less, and specifically was found to be 0.08.

Preparation of Thermal Transfer Sheet Y

Similarly to the thermal transfer sheet K, a thermal transfer sheet Y was prepared except that a coating solution for the yellow image-forming layer having the following composition was used in place of the coating solution for the black image-forming layer. The thickness of the image-forming layer of the resulting thermal transfer sheet Y was 0.42 μm.

| [Composition of Mother Liquid of Yellow Pigment Dispersion] | |
|---|---|
| Yellow Pigment Composition 1: | |
| Polyvinylbutyral (Ethleck B BL-SH, Manufactured by Sekisui Chemical Co., Ltd.) | 7.1 parts |
| Pigment Yellow 180 (C. I. No. 21290) (Novoperm Yellow | 12.9 parts |

-continued

| | |
|---|---|
| P-HG, Manufactured by Clariant Japan K.K.) | |
| Dispersion agent (Solsperse S-20000, Manufactured by ICI K.K.) | 0.6 part |
| n-Propyl alcohol | 79.4 parts |
| Yellow Pigment Composition 2: | |
| Polyvinylbutyral (Ethleck B BL-SH, Manufactured by Sekisui Chemical Co., Ltd.) | 7.1 parts |
| Pigment Yellow 139 (C. I. No. 56298) (Novoperm Yellow M2R 70, Manufactured by Clariant Japan K.K.) | 12.9 parts |
| Dispersion Agent (Solsperse S-20000, Manufactured by ICI K.K.) | 0.6 part |
| n-Propyl alcohol | 79.4 parts |

| [Composition of Coating Solution for Yellow Image Formation Layer] | |
|---|---|
| The aforesaid mother liquids for yellow pigment dispersions Yellow pigment composition 1:Yellow pigment composition 2 = 95:5 (parts) | 126 parts |
| Polyvinylbutyral (Ethleck B BL-SH, Manufactured by Sekisui Chemical Co., Ltd.) | 4.6 parts |
| Wax compounds | |
| (Stearic amide, Neutron 2, Manufactured by Nippon Fine Chemical Co., Ltd.) | 0.7 part |
| (Behenic amide, Diamid BM, Manufactured by Nippon Kasei Chemical Co., Ltd.) | 0.7 part |
| (Lauric amide, Diamid Y, Manufactured by Nippon Kasei Chemical Co., Ltd.) | 0.7 part |
| (Palmitic amide, Diamid KP, Manufactured by Nippon Kasei Chemical Co., Ltd.) | 0.7 part |
| (Erucic amide, Diamid L-200, Manufactured by Nippon Kasei Chemical Co., Ltd.) | 0.7 part |
| (Oleic amide, Diamid O-200, Manufactured by Nippon Kasei Chemical Co., Ltd.) | 0.7 part |
| Nonionic surface active agent (Chemistat 1100, Manufactured by Sanyo Chemical Industries, Ltd.) | 0.4 part |
| Rosin (KE-311, Manufactured by Arakawa Chemical Industries, Ltd.) (Components: resin acids: 80 to 97% Resin Acid Components: Abietic acid: 30 to 40%, Neoabietic acid: 10 to 20%, Dihydroabietic acid: 14%, ¥ Tetrahydroabietic acid: 14%.) | 2.4 parts |
| Surface active agent (Compounds as described in Table 1) | 0.2 part |
| n-Propyl alcohol | 793 parts |
| Methyl ethyl ketone | 198 parts |

The physical properties of the resulting image-forming layer were as follows.

The surface hardness of the image-forming layer is preferably 10 g or more by use of a sapphire needle, and specifically was found to be 200 g or more.

The smooster value of the surface is preferably from 0.5 to 50 mmHg (about from 0.0665 to 6.65 kPa) at 23° C.—55% RH, and specifically was found to be 2.3 mmHg (about 0.31 kPa).

The coefficient of static friction of the surface is preferably 0.2 or less, and specifically was found to be 0.1.

Preparation of Thermal Transfer Sheet M

Similarly to the thermal transfer sheet K, a thermal transfer sheet M was prepared except that a coating solution for the magenta image-forming layer having the following composition was used in place of the coating solution for the black image-forming layer. The thickness of the image-forming layer of the resulting thermal transfer sheet M was 0.38 $\mu$m.

| [Composition of Mother liquid for Magenta Pigment Dispersion] | |
|---|---|
| Magenta Pigment Composition 1: | |
| Polyvinylbutyral (Denka Butyral #2000-L, Manufactured by Denki Kagaku Kogyo K.K., Vicat softening point: 57° C.) | 12.6 parts |
| Pigment Red 57:1 (C. I. No. 15850:1) (Symuler Brilliant Carmine 6B-229, Manufactured by Dainippon Ink and Chemicals, Inc.) | 15.0 parts |
| Dispersion agent (Solsperse S-20000, Manufactured by ICI K.K.) | 0.6 part |
| n-Propyl alcohol | 80.4 parts |
| Magenta Pigment Composition 2: | |
| Polyvinylbutyral (Denka Butyral #2000-L, Manufactured by Denki Kagaku Kogyo K.K., Vicat softening point: 57° C.) | 12.6 parts |
| Pigment Red 57:1 (C. I. No. 15850:1) (Lionol Red 6B-4290G, Manufactured by Toyo Ink Mfg. Co., Ltd.) | 15.0 parts |
| Dispersion agent (Solsperse S-20000, Manufactured by ICI K.K.) | 0.6 parts |
| n-Propyl alcohol | 79.4 parts |

| [Composition of Coating Solution for Magenta Image Formation Layer] | |
|---|---|
| The aforesaid mother liquids for magenta pigment dispersion Magenta pigment composition 1:magenta pigment composition 2 = 95:5 (parts) | 163 parts |
| Polyvinylbutyral (Denka Butyral #2000-L, Manufactured by Denki Kagaku Kogyo K.K., Vicat softening point: 57° C.) | 4.0 parts |
| Wax compounds | |
| (Stearic amide, Neutron 2, Manufactured by Nippon Fine Chemical Co., Ltd.) | 1.0 part |
| (Behenic amide, Diamid BM, Manufactured by Nippon Kasei Chemical Co., Ltd.) | 1.0 part |
| (Lauric amide, Diamid Y, Manufactured by Nippon Kasei Chemical Co., Ltd.) | 1.0 part |
| (Erucic amide, Diamid L-200, Manufactured by Nippon Kasei Chemical Co., Ltd.) | 1.0 part |
| (Oleic amide, Diamid O-200, Manufactured by Nippon Kasei Chemical Co., Ltd.) | 1.0 part |
| Nonionic surface active agent (Chemistat 1100, Manufactured by Sanyo Chemical Industries, Ltd.) | 0.7 part |
| Rosin (KE-311, Manufactured by Arakawa Chemical Industries, Ltd.) (Components: Resin acids: 80 to 97%; Resin acid components: Abietic acid: 30 to 40%, Neoabietic acid: 10 to 20% Dihydroabietic acid: 14%, Tetrahydroabietic acid: 14%) | 4.6 parts |
| Pentaerythritol tetraacrylate (NK Ester A-TMMT, Manufactured by Shin-Nakamura Kagaku K.K.) | 2.5 parts |
| Surface active agent (Compounds as described in Table 1) | 0.3 part |
| n-Propyl alcohol | 848 parts |
| Methyl ethyl ketone | 246 parts |

The physical properties of the resulting image-forming layer were as follows.

The surface hardness of the image-forming layer is preferably 10 g or more by use of a sapphire needle, and specifically was found to be 200 g or more.

The smooster value of the surface is preferably from 0.5 to 50 mmHg (about from 0.0665 to 6.65 kPa) at 23° C.—55% RH, and specifically was found to be 3.5 mmHg (about 0.47 kPa).

The coefficient of static friction of the surface is preferably 0.2 or less, and specifically was found to be 0.08.

Preparation of Thermal Transfer Sheet C

Similarly to the thermal transfer sheet K, a thermal transfer sheet C was prepared except that a coating solution for the cyan image-forming layer having the following composition was used in place of the coating solution for the black image-forming layer. The thickness of the image-forming layer of the resulting thermal transfer sheet C was 0.45 μm.

| [Composition of Mother Liquid of Cyan Pigment Dispersion] | |
|---|---|
| Cyan Pigment Composition 1: | |
| Polyvinylbutyral (Ethleck B BL-SH, Manufactured by Sekisui Chemical Co., Ltd.) | 12.6 parts |
| Pigment Blue 15:4 (C. I. No. 74160) (Cyanine Blue 700-10FG, Manufactured by Toyo Ink Mfg. Co., Ltd.) | 15.0 parts |
| Dispersion agent (PW-36, Manufactured by Kusumoto Kasei K.K.) | 0.8 part |
| n-Propyl alcohol | 110 parts |
| Cyan Pigment Composition 2: | |
| Polyvinylbutyral (Ethleck B BL-SH, Manufactured by Sekisui Chemical Co., Ltd.) | 12.6 parts |
| Pigment Blue (C. I. No. 74160) (Lionol Blue 7027, Manufactured by Toyo Ink Mfg. Co., Ltd.) | 15.0 parts |
| Dispersion agent (PW-36, Manufactured by Kusumoto Kasei K.K.) | 0.8 part |
| n-Propyl alcohol | 110 parts |

| [Composition of Coating Solution for Cyan Image Formation Layer] | |
|---|---|
| The aforesaid mother liquid of cyan pigment dispersion Cyan pigment composition 1:Cyan pigment composition 2 = 90:10 (parts) | 118 parts |
| Polyvinylbutyral (Ethleck B BL-SH, Manufactured by Sekisui Chemical Co., Ltd.) | 5.2 parts |
| Inorganic pigment MEK-ST | 1.3 parts |
| Wax Compounds | |
| (Stearic amide, Neutron 2, Manufactured by Nippon Fine Chemical Co., Ltd.) | 1.0 part |
| (Behenic amide, Diamid BM, Manufactured by Nippon Kasei Chemical Co., Ltd.) | 1.0 part |
| (Lauric amide, Diamid Y, Manufactured by Nippon Kasei Chemical Co., Ltd.) | 1.0 part |
| (Palmitic amide, Diamid KP, Manufactured by Nippon Kasei Chemical Co., Ltd.) | 1.0 part |
| (Erucic amide, Diamid L-200, Manufactured by Nippon Kasei Chemical Co., Ltd.) | 1.0 part |
| (Oleic amide, Diamid O-200, Manufactured by Nippon Kasei Chemical Co., Ltd.) | 1.0 part |

-continued

| | |
|---|---|
| Rosin (KE-311, Manufactured by Awakawa Chemical Industries, Ltd.) (Components: Resin acids: 80 to 97%, Resin acid components: Abietic acid: 30 to 40%, Neoabietic acid: 10 to 20%, Dihydroabietic acid: 14%, Tetrahydroabietic acid: 14%) | 2.8 parts |
| Pentaerythritol tetraacrylate (NK Ester A-TMMT, Manufactured by Shin-Nakamura Kagaku K.K.) | 1.7 parts |
| Surface active agent (Compounds as described in Table 1) | 0.4 part |
| n-Propyl alcohol | 890 parts |
| Methyl ethyl ketone | 247 parts |

The physical properties of the resulting image-forming layer were as follows.

The surface hardness of the image-forming layer is preferably 10 g or more by use of a sapphire needle, and specifically was found to be 200 g or more.

The smooster value of the surface is preferably from 0.5 to 50 mmHg (about from 0.0665 to 6.65 kPa) at 23° C.—55% RH, and specifically was found to be 7.0 mmHg (about 0.93 kPa).

The coefficient of static friction of the surface is preferably 0.2 or less, and specifically was found to be 0.08.

Uniformity and properties of transferring uniformly of the image-forming layer's surface of the respective thermal transfer sheets prepared above were evaluated according to the following methods. Results are shown in Table 2.

Evaluation of Uniformity of Surface of Image-forming layer:

The surfaces were inspected with the naked eye on sharkustein to evaluate the degrees of cissing and unevenness.

o: not observed,

Δ: somewhat observed, x: fairly observed

Evaluation of Properties of Transferring Uniformly:

Images transferred to the following image-receiving sheets according to the following transfer method were inspected with the naked eye.

o: No defect and unevenness are observed.

x: Defect and unevenness are observed.

TABLE 2

| | Fluorine-Series Surface Active Agent | Uniformity of Coated Surface | Properties of Transferring |
|---|---|---|---|
| Example 1-1 | Compound 1 | ○ | ○ |
| Example 1-2 | Compound 2 | ○ | ○ |
| Example 1-3 | Compound 3 | ○ | ○ |
| Example 1-4 | Compound 4 | ○ | ○ |
| Example 1-5 | Compound 5 | ○ | ○ |
| Example 1-6 | Megafack F178K | ○ | ○ |
| Example 1-7 | Megafack F470 | ○ | ○ |
| Example 1-8 | Megafack F475 | ○ | ○ |
| Example 1-9 | Megafack F476 | ○ | ○ |
| Comparative Example 1-1 | Megafack F113 | Δ, x | x |
| Comparative Example 1-2 | None | x | ○ |

F113: $C_8F_{17}SO_3Na$

Preparation of Image-Receiving Sheet

A coating solution for the cushion layer and a coating solution for the image-receiving layer having the following compositions were prepared, respectively.

| | |
|---|---|
| 1. Coating Solution for Cushion Layer | |
| Vinyl chloride/vinyl acetate copolymer (Main binder) (MPR-TSL, Manufactured by Nissin Kagaku K.K.) | 20 parts |
| Plasticizer (Paraprex G-40, Manufactured by CP. HALL. COMPANY. | 10 parts |
| Surface active agent (Fluorine-series, Coating Aid) (Megafax F-177, Manufactured by Dainippon Ink and Chemicals, Inc.) | 0.5 part |
| Antistatic agent (Quaternary ammonium salt) (SAT-5 Supper (IC), Manufactured by Nippon Jun-yaku K.K.) | 0.3 part |
| Methyl ethyl ketone | 60 parts |
| Toluene | 10 parts |
| N,N-Dimethylformamide | 3 parts |
| 2. Coating Solution for Image-Receiving Layer | |
| Polyvinylbutyral (Binder) (Ethleck B BL-1, Manufactured by Sekisui Chemical Co., Ltd.) | 117 parts |
| Half ester of styrene/maleic acid (Binder) (Oxylack SH-128, Manufactured by Nippon Shokubai Co., Ltd.) | 63 parts |
| Antistatic agent (Chemistat 3033, Manufactured by Sanyo Chemical Industries, Ltd.) | 16 parts |
| Surface active agent (Megafack F-176PF, Manufactured by Dainippon Ink and Chemicals, Inc.) | 1.2 parts |
| n-Propyl alcohol | 570 parts |
| Methanol | 1200 parts |
| 1-Methoxy-2-propanol | 520 parts |

By use of a narrow coater, a white PET support (Lumilar #130E58, Manufactured by Toray Industries, Inc., Thickness: 130 μm) was coated with the coating solution for the cushion layer and dried, and subsequently coated with the coating solution for the image-receiving layer and dried. The respective amounts of the coating solutions were adjusted so as to become about 20 μm in thickness of the dried cushion layer and about 2 μm in thickness of the dried image-receiving layer. The white PET support is a void-containing plastic support that was a laminated product (Entire thickness: 130 μm, Specific gravity: 0.8) consisting of a void-containing polyethylene terephthalate layer (Thickness: 116 μm, Void volume: 20%) and two titanium oxide-containing polyethylene terephthalate layers (Thickness: 7 μm, Content of titanium oxide: 2%) provided on both sides of the void-containing layer. The image-receiving sheet thus prepared was wound in roll form, allowed to stand at room temperature for one week, and used for image recording with the aid of a laser beam as described below.

Formation of Transfer Image

The image-receiving sheet (56 cm×79 cm) prepared above was wound on a revolving drum having a 35-cm diameter and vacuum suction holes of 1-mm diameter (a surface density of one hole per 3 cm×8 cm) and attracted under reduced pressure. Subsequently, the thermal transfer sheet K cut into 61 cm×84 cm was superposed on the image-receiving sheet so that the thermal transfer sheet K uniformly protruded from the image-receiving sheet and allowed to adhere to each other by evacuating the air through the suction holes while squeezing with a squeeze roller. The degree of evacuation was −150 mmHg (about 81.13 kPa) to 1 atm in a condition where the holes were closed. The laser image (printing image) recording was carried out on the laminated product by collecting a semiconductor laser beam of a wavelength of 808 nm on the surface of the laminated product on the drum from the outside so as to form spots of 7-μm size on the surface of the light-to-heat conversion layer while moving the beam in the direction rectangular (sub-scanning direction) to the revolving direction (main scanning direction) of the drum. The conditions of irradiation with the laser are as follows. The laser beam used in the invention has a multi-beam two-dimensional arrangement of a parallelogram consisting of 5 rows in the main scanning direction and 3 rows in the sub-scanning direction.

| | |
|---|---|
| Laser power | 110 mW |
| Number of revolution of drum | 500 rpm |
| Sub-scanning pitch | 6.35 μm |

Temperatures and humidities of environment:

Three conditions of 18° C.—30%, 23° C.—50%, and 26° C.—65%.

The diameter of the exposure drum is preferably 360 mm or more and specifically that of the drum used was 380 mm.

The size of an image was 515 mm×728 mm and the resolving power was 2600 dpi.

The laminated product having undergone the laser recording was taken out of the drum, and the thermal transfer sheet K was manually peeled off from the image-receiving sheet. It was found that only areas irradiated with the beam on the image-forming layer of the thermal transfer sheet K were transferred from the thermal transfer sheet K to the image-receiving sheet.

In a similar manner to the thermal transfer sheet K, images were transferred from the thermal transfer sheet Y, the thermal transfer sheet M, and thermal transfer sheet C to the image-receiving sheets, respectively. The transfer images of four colors were further transferred to a recording sheet to form a multicolor image. Even when the high-energy laser recording is carried out by use of laser beams of the multi-beam two-dimensional arrangement under the conditions different in temperature and humidity, the resulting image qualities were good and a multicolor image formed having stable transfer density was formed.

The transfer to the printing paper was carried out by use of thermal transfer apparatus where the coefficient of dynamic friction to polyethylene terephthalate that was a material of the insertion table was from 0.1 to 0.7 and the carrying rate was from 15 to 50 mm/sec. The Vickers hardness of a material for the heat roll of thermal transfer apparatus is preferably from 10 to 1000 and specifically that of the material for the heat roll of the apparatus used was 70.

The resulting images all were good under the three conditions different in environmental temperature and humidity.

Examples 2-1 to 2-9 and Comparative Examples 2-1 and 2-2

Preparation of Thermal Transfer Sheets

Similarly to Example 1-1, the thermal transfer sheets K (black), Y (yellow), M (magenta), and C (cyan) were prepared except that "Megafack F-176PF (Trade name, Solid content: 20%, Manufactured by Dainippon Ink and Chemicals, Inc.) was used as the surface active agent in an amount of 2.1 parts for the coating solution for the black image-forming layer, in an amount of 0.8 part for that for the yellow image-forming layer, in an amount of 1.3 parts for that for the magenta image-forming layer, and in an amount of 1.7 parts for that for the cyan image-forming layer, respectively.

Particles in the resulting coating solution for the black image-forming layer were checked by use of a particle size distribution instrument of laser-scattering system. The average particle size was 0.25 μm and the ratio of particles having sizes of 1 μm or more was 0.5%.

The respective physical properties of the image-forming layers of the resulting thermal transfer sheets K, Y, M, and C were as follows.

[Physical Properties of Image-Forming Layer of Heat Transfer Sheet K]

The thickness of the layer was measured and found to be 0.60 μm on average.

The optical density of the layer was measured with a Macbeth densitometer TD-904 (W filter) and found to be 0.91.

The surface hardness of the layer is preferably 10 g or more by use of a sapphire needle and specifically was found to be 200 g or more.

The smooster value of the surface is preferably from 0.5 to 50 mmHg (about from 0.0665 to 6.65 kPa) at 23° C.—55% RH and specifically was found to be 9.3 mmHg (about 1.24 kPa).

The coefficient of static friction of the surface is preferably 0.2 or less and specifically was found to be 0.08.

[Physical Properties of Image-Forming Layer of Heat Transfer Sheet Y]

The thickness of the layer was found to be 0.42 μm.

The surface hardness of the layer is preferably 10 g by use of a sapphire needle, and specifically was found to be 200 g or more.

The smooster value of the surface is preferably from 0.5 to 50 mmHg (about from 0.0665 to 6.65) at 23° C.—55% RH and specifically was found to be 2.3 mmHg (about 0.31 kPa).

The coefficient of static friction of the surface is preferably 0.2 or less and specifically was found to be 0.1.

[Physical Properties of Image-Forming Layer of Heat Transfer Sheet M]

The thickness of the layer was found to be 0.38 μm.

The surface hardness of the layer is preferably 10 g by use of a sapphire needle and specifically was found to be 200 g or more.

The smooster value of the surface is preferably from 0.5 to 50 mmHg (about from 0.0665 to 6.65 kPa) at 23° C.—55% RH and specifically was found to be 3.5 mmHg (about 0.47 kPa).

The coefficient of static friction of the surface is preferably 0.2 or less and specifically was found to be 0.08.

[Physical Properties of Image-Forming Layer of Heat Transfer Sheet C]

The thickness of the layer was 0.45 μm.

The surface hardness of the layer is preferably 10 g or more by use of a sapphire needle and specifically was found to be 200 g or more.

The smooster value of the surface is preferably from 0.5 to 50 mmHg (about from 0.0665 to 6.65 kPa) at 23° C.—55% RH and specifically was found to be 7.0 mmHg (about 0.93 kPa).

The coefficient of static friction of the surface is preferably 0.2 or less and specifically was found to be 0.08.

Preparation of Image-Receiving Sheet

A coating solution for the cushion layer and a coating solution for the image-receiving layer having the following compositions were prepared, respectively.

| | |
|---|---|
| **1. Coating Solution for Cushion Layer** | |
| Vinyl chloride/vinyl acetate copolymer (Main binder) (MPR-TSL, Manufactured by Nisshin Kagaku K.K.) | 20 parts |
| Plasticizer (Parafrex G-40, Manufactured by CP. HALL. COMPANY) | 10 parts |
| Surface active agent (Fluorine-series, Coating aid) (Surface active agents as described in Table 3) | 0.5 part |
| Antistatic agent (Quaternary ammonium salt) (SAT-5, Supper (IC), Manufactured by Nippon Jun-yaku K.K.) | 0.3 part |
| Methyl ethyl ketone | 60 parts |
| Toluene | 10 parts |
| N,N-Dimethylformamide | 3 parts |
| **2. Coating Solution for Image-Receiving Layer** | |
| Polyvinylbutyral (Ethleck B BL-1, Manufactured by Sekisui Chemical Co., Ltd.) | 117 parts |
| Half ester of styrene/maleic acid (Oxylack SH-128, Manufactured by Nippon Shokubai Co., Ltd.) | 63 parts |
| Antistatic agent (Chemistat 3033, Manufactured by Sanyo Chemical Industries, Ltd.) | 16 parts |
| Surface active agent (Surface active agents as described in Table 3) | 1.2 parts |
| n-Propyl alcohol | 570 parts |
| Methanol | 1200 parts |
| 1-Methoxy-2-propanol | 520 parts |

By use of a narrow coater, a white PET support (Lumilar #130E58, Manufactured by Toray Industries, Inc., Thickness: 130 μm) was coated with the coating solution for forming the cushion layer and dried, and subsequently coated with the coating solution for the image-receiving layer and dried. The respective amounts of the coating solutions were adjusted so that the thickness of the cushion layer dried became about 20 μm and that of the image-receiving layer became about 2 μm. The white PET support was a void-containing plastic support that was a laminated product (Entire thickness: 130 μm, Specific gravity: 0.8) consisting of a void-containing polyethylene terephthalate layer (Thickness: 116 μm, Void volume: 20%) and titanium oxide-containing polyethylene terephthalate layers (Thickness: 7 μm, Content of titanium oxide: 2%) provided on both sides thereof. The image-receiving sheet prepared was wound in roll form, allowed to stand at room temperature for one week, and used for the following image recording with the aim of a laser beam.

The respective coated surfaces of the cushion layer and the image-receiving layer formed in the image-receiving sheet were inspected with the naked eye and evaluated according to the following three grades. Results are shown in Table 3 as described below.

Evaluation of Coated Surfaces o: No cissing and unevenness are observed.

Δ: Cissing and unevenness are partly observed.

x: Cissing and unevenness are observed all over the surface.

The surface active agents shown in the following Table 3 are those described in Table 1.

Formation of Transfer Image

The image-receiving sheet (56 cm×79 cm) as prepared above was wound on a revolving drum having a 38-cm diameter and vacuum suction holes of 1-mm diameter (a surface density of one hole per 3 cm×8 cm) formed thereon and attracted under reduced pressure. The thermal transfer sheet K (black) cut into 61 cm×84 cm was superposed on the image-receiving sheet so that the thermal transfer sheet K uniformly protruded from the image-receiving sheet and allowed to adhere to each other by evacuating the air through the suction holes while squeezing with a squeezing roller. The degree of evacuation was −150 mmHg (about 81.13 kPa) to 1 atm in a condition where the section holes were closed. The laser image (printing image) recording was carried out on the laminated product by collecting a semiconductor laser beam of a wavelength of 808 nm on the surface of the laminated product placed on the drum from the outside so as to form spots of 7-μm size on the surface of the light-to-heat conversion layer while moving the beam in the direction (sub-scanning direction) rectangular to the revolving direction (main scanning direction) of the drum. Conditions of the irradiation with the laser are as follows. The laser beam used in the invention has a multi-beam two-dimensional arrangement of a parallelogram consisting of 5 rows in the main scanning direction and 3 rows in the sub-scanning direction.

| | |
|---|---|
| Laser power | 110 mW |
| Number of revolution of drum | 500 rpm |
| Sub-scanning pitch | 6.35 μm |

Environmental temperatures and humidities:

three conditions of 18° C.—30%, 23° C.—50%, and 26° C.—65%.

The diameter of the exposure drum is preferably 360 mm or more and specifically that of a drum used was 380 mm.

The image size was 515 mm×728 mm and the resolving power was 2600 dpi.

The laminated product having undergone the laser recording was taken out of the drum and the thermal transfer sheet K was manually peeled off from the image-receiving sheet. It was confirmed that only areas irradiated with the beams in the image-forming layer of the thermal transfer sheet K was transformed from the thermal transfer sheet K to the image-receiving sheet.

The resulting images all were good under three conditions different in environmental temperature and humidity.

Similarly to the thermal transfer sheet K, images were transferred from the thermal transfer sheets Y, M, and C to the image-receiving sheets, respectively. Transfer images of four colors were further transferred to a recording sheet to form a multicolor image. High-energy laser recording was carried out by use of laser beams having multi-beam two-dimensional arrangement under the conditions different in environmental temperature and humidity.

The properties of transferring uniformly were evaluated according to the following method. Results are shown in Table 3.

Evaluation of Properties of Transferring Uniformly

Images transferred to the image-receiving sheets were evaluated by inspection with the naked eye.

o: No defect and unevenness were observed.

x: Defects and unevenness were observed.

TABLE 3

| | Surface Active Agent | | Conditions of Coated Surfaces | | Properties of |
|---|---|---|---|---|---|
| | Cushion Layer | Image-Receiving Layer | Cushion Layer | Image-Receiving Layer | Transferring |
| Example 2-1 | Compound 1 | Compound 2 | ○ | ○ | ○ |
| Example 2-2 | Compound 1 | Compound 1 | ○ | ○ | ○ |
| Example 2-3 | Compound 1 | Compound 3 | ○ | ○ | ○ |
| Example 2-4 | Compound 1 | F475 | ○ | ○ | ○ |
| Example 2-5 | Compound 1 | F476 | ○ | ○ | ○ |
| Example 2-6 | F470 | Compound 1 | ○ | ○ | ○ |
| Example 2-7 | F475 | Compound 1 | ○ | ○ | ○ |
| Example 2-8 | F476 | Compound 1 | ○ | ○ | ○ |
| Example 2-9 | Compound 5 | Compound 1 | ○ | ○ | ○ |
| Comparative Example 2-1 | F113 | F113 | Δ | X | X |
| Comparative Example 2-2 | None | None | X | X | X |

F113: $C_8F_{17}SO_3Na$

Table 3 reveals that when the homopolymers prepared from the monomers represented by formula 1 are added to the coating solutions for the image-receiving layer and the cushion layer, these layers are excellent in condition of the surfaces and also in properties of transferring and uniformity of images.

The transfer to the printing paper was carried out by use of thermal transfer apparatus where the coefficient of dynamic friction was from 0.1 to 0.7 to polyethylene terephthalate that was the material of the insertion table and the carrying rate was from 15 to 50 mm/sec. The Vickers hardness of a material for the heat roll of thermal transfer apparatus is preferably from 10 to 100 and specifically that of the material for the heat roll of the apparatus used was 70.

Example 3

An experiment and an evaluation were conducted in the same manner as Example 1-1, except for using the image-receiving sheet used in Example 2-1. Uniformity of Surface of the image-forming layer and the image-receiving layer were both good (o: not observed), and Properties of Transferring Uniformly was better than in case that evaluation was good (o: No defect and unevenness are observed).

The entire disclosure of each and every foreign patent application from which the benefit of foreign priority has been claimed in the present application is incorporated herein by reference, as if fully set forth.

What is claimed is:

1. A multicolor image-forming material comprising:

an image-receiving sheet comprising a support, a cushion layer, and an image-receiving layer; and at least four thermal transfer sheets each comprising a support, a light-to-heat converting layer and an image-forming layer, and each having a different color, at least one layer of the image-receiving layer and the cushion layer, and each of the image-forming layers comprises a flourine-series surface active agent which is homopolymer prepared from a polymerizable monomer represented by the following formula (1) and having a weight average molecular weight Mw of 3000 or more:

$$C_nF_{2n+1}\text{-L-}CH_2CH_2\text{—O—C(=O)—CR=}CH_2 \quad (1)$$

wherein n represents an integer of from 2 to 14, R represents a hydrogen atom or an alkyl group having 1 to 10 carbon atoms, and L represents a single bond or a divalent organic group comprising at least one of an oxygen atom, a nitrogen atom, a sulfur atom and a carbon atom, wherein an image is formed by the method comprising the steps of:

superposing each one of the at least four thermal transfer sheets on the image-receiving sheet to be in a state of the image-forming layer being in contact with the image-receiving layer; and irradiating the thermal transfer sheet with a laser beam to transfer an image in an area of the image-forming layer subjected to irradiation onto the image-receiving layer.

2. The multicolor image-forming material according to claim 1, wherein the flourine-series surface active agent is a homopolymer comprising a polymerizable monomer represented by the following formula (2):

$$C_nF_{2n+1}\text{—}CH_2CH_2SO_2N(\text{—}R_1)\text{—}CH_2CH_2\text{—O—C(=O)—CR=}CH_2 \quad (2)$$

wherein $R_1$ represents a hydrogen atom or an alkyl group having 1 to 10 carbon atoms, n represents an integer of from 2 to 14 and R represents a hydrogen atom or an alkyl group having 1 to 10 carbon atoms.

3. A method for forming a multicolor image using the multicolor image-forming material according to claim 1, the method comprising the steps of:

preparing an image-receiving sheet comprising a support and an image-receiving layer and at least four thermal transfer sheets each comprising a support, a light-to-heat converting layer and an image-forming layer, the at least four thermal transfer sheets comprising yellow, magenta, cyan and black thermal transfer sheets;

superposing each one of the at least four thermal transfer sheets on the image-receiving sheet to be in a state of the image-forming layer being in contact with the image-receiving layer; and irradiating the thermal transfer sheet with a laser beam to transfer an image in an area of the image-forming layer subjected to irradiation onto the image-receiving layer.

4. A method for forming a multicolor image using the multicolor image-forming material according to claim 2, the method comprising the steps of:

preparing an image-receiving sheet comprising a support and an image-receiving layer and at least four thermal transfer sheets each comprising a support, a light-to-heat converting layer and an image-forming layer, the at least four thermal transfer sheets comprising yellow, magenta, cyan and black thermal transfer sheets;

superposing each one of the at least four thermal transfer sheets on the image-receiving sheet to be in a state of the image-forming layer being in contact with the image-receiving layer; and irradiating the thermal transfer sheet with a laser beam to transfer an image in an area of the image-forming layer subjected to irradiation onto the image-receiving layer.

* * * * *